United States Patent
Wu et al.

(10) Patent No.: US 12,356,558 B2
(45) Date of Patent: Jul. 8, 2025

(54) ELECTRONIC ASSEMBLY HAVING CIRCUIT CARRIER

(71) Applicant: Taiwan Semiconductor Manufacturing Company, Ltd., Hsinchu (TW)

(72) Inventors: Jiun-Yi Wu, Taoyuan (TW); Chien-Hsun Lee, Hsin-chu County (TW); Chen-Hua Yu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 200 days.

(21) Appl. No.: 18/302,005

(22) Filed: Apr. 18, 2023

(65) Prior Publication Data
US 2023/0254984 A1 Aug. 10, 2023

Related U.S. Application Data

(63) Continuation of application No. 17/314,048, filed on May 7, 2021, now Pat. No. 11,665,834, which is a continuation of application No. 16/860,012, filed on Apr. 27, 2020, now Pat. No. 11,006,532, which is a continuation of application No. 16/218,489, filed on Dec. 13, 2018, now Pat. No. 10,638,616.

(60) Provisional application No. 62/752,362, filed on Oct. 30, 2018.

(51) Int. Cl.
*H05K 3/46* (2006.01)
*H05K 1/11* (2006.01)
*H05K 1/18* (2006.01)

(52) U.S. Cl.
CPC ........... *H05K 3/4691* (2013.01); *H05K 1/115* (2013.01); *H05K 1/118* (2013.01); *H05K 1/189* (2013.01)

(58) Field of Classification Search
CPC ....... H05K 3/4691; H05K 1/115; H05K 1/118
USPC ....................................... 174/254
See application file for complete search history.

(56) References Cited

U.S. PATENT DOCUMENTS

| | | | |
|---|---|---|---|
| 4,931,134 A | 6/1990 | Hatkevitz et al. |
| 5,072,074 A | 12/1991 | DeMaso et al. |
| 5,121,297 A | 6/1992 | Haas |
| 5,206,463 A | 4/1993 | DeMaso et al. |
| 5,219,292 A | 6/1993 | Dickirson et al. |

(Continued)

FOREIGN PATENT DOCUMENTS

| | | |
|---|---|---|
| CN | 1717158 A | 1/2006 |
| CN | 1778153 A | 5/2006 |

(Continued)

*Primary Examiner* — Timothy J Thompson
*Assistant Examiner* — Michael F McAllister
(74) *Attorney, Agent, or Firm* — Slater Matsil, LLP

(57) ABSTRACT

An electronic assembly includes a first wafer including a stack of alternating first dielectric layers and first circuit layers, a flexible structure including a second dielectric layer and a second circuit layer covered by the second dielectric layer, and a second wafer stacked upon the first wafer and including chip packages arranged in an array. The flexible structure includes a first region embedded in the first wafer and a second region connected to the first region and extending out from an edge of the first wafer. The chip packages are electrically coupled to the second circuit layer of the flexible structure through the first circuit layers of the first wafer.

20 Claims, 19 Drawing Sheets

(56) References Cited

U.S. PATENT DOCUMENTS

| | | | |
|---|---|---|---|
| 6,288,343 B1 | 9/2001 | Ahn et al. | |
| 7,982,135 B2 * | 7/2011 | Takahashi | H05K 3/4691 |
| | | | 174/254 |
| 8,188,372 B2 | 5/2012 | Sato et al. | |
| 8,198,543 B2 | 6/2012 | Kang et al. | |
| 8,354,596 B2 | 1/2013 | Takahashi | |
| 8,536,457 B2 | 9/2013 | Takahashi | |
| 8,609,991 B2 | 12/2013 | Takahashi | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,155,209 B2 | 10/2015 | Sato et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,674,968 B2 * | 6/2017 | Kim | H05K 1/028 |
| 9,717,151 B2 * | 7/2017 | Taniguchi | H05K 3/4691 |
| 9,743,533 B2 | 8/2017 | Tsai | |
| 9,807,877 B1 | 10/2017 | Liu et al. | |
| 2006/0193970 A1 | 8/2006 | Myung et al. | |
| 2008/0047135 A1 | 2/2008 | Arnold | |
| 2008/0047737 A1 | 2/2008 | Sahara et al. | |
| 2008/0093118 A1 | 4/2008 | Takahashi et al. | |
| 2009/0084583 A1 | 4/2009 | Ueno | |
| 2009/0180733 A1 * | 7/2009 | Hwang | H01L 23/5387 |
| | | | 257/E23.114 |
| 2009/0229876 A1 | 9/2009 | Takahashi | |
| 2010/0025087 A1 | 2/2010 | Takahashi | |
| 2010/0084169 A1 | 4/2010 | Nakamura et al. | |
| 2010/0155109 A1 | 6/2010 | Takahashi | |
| 2010/0201462 A1 | 8/2010 | Blair et al. | |
| 2011/0067904 A1 * | 3/2011 | Aoyama | H05K 3/4069 |
| | | | 174/254 |
| 2011/0075374 A1 | 3/2011 | Kang et al. | |
| 2011/0203837 A1 | 8/2011 | Naganuma et al. | |
| 2013/0161078 A1 | 6/2013 | Li | |
| 2013/0213695 A1 | 8/2013 | Lee et al. | |
| 2015/0319844 A1 | 11/2015 | Kim et al. | |
| 2016/0183363 A1 | 6/2016 | Lee et al. | |
| 2017/0118838 A1 * | 4/2017 | Williams | H05K 3/361 |
| 2018/0302979 A1 | 10/2018 | Lee et al. | |

FOREIGN PATENT DOCUMENTS

| | | |
|---|---|---|
| CN | 101310574 A | 11/2008 |
| CN | 101658081 A | 2/2010 |
| CN | 102740612 A | 10/2012 |
| TW | 200731882 A | 8/2007 |
| TW | 201242463 A | 10/2012 |
| TW | 201633865 A | 9/2016 |

\* cited by examiner

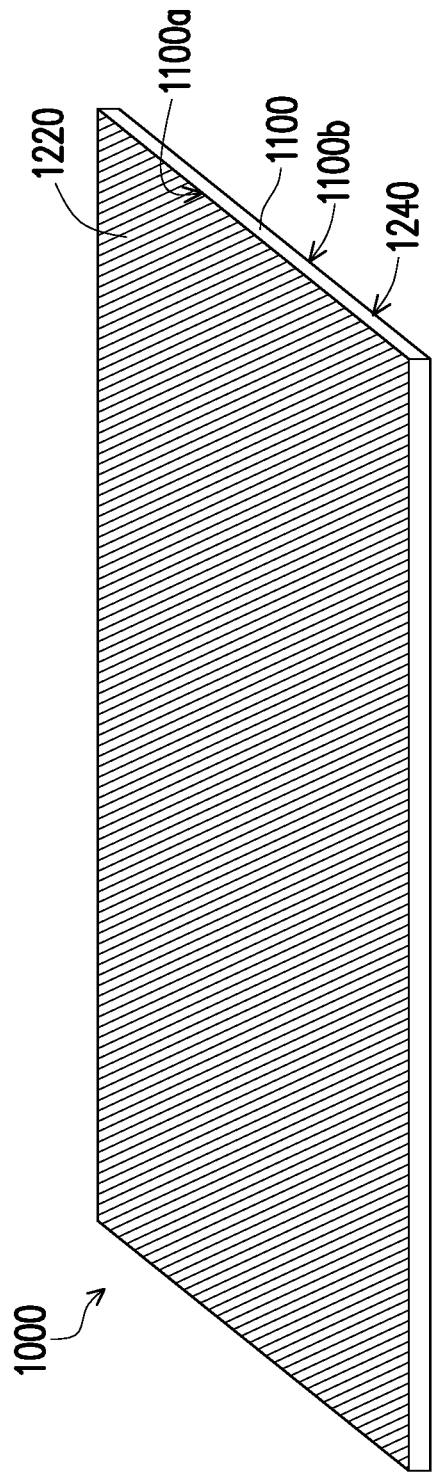
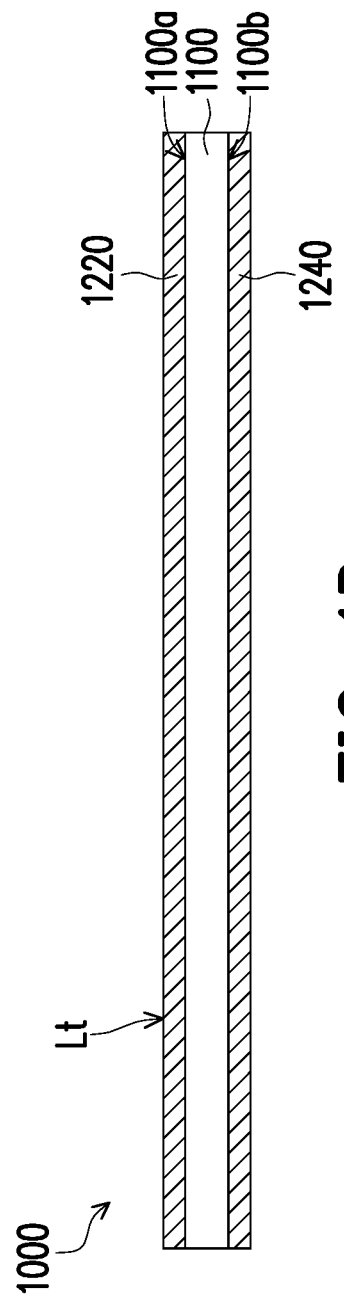
FIG. 1A
FIG. 1B

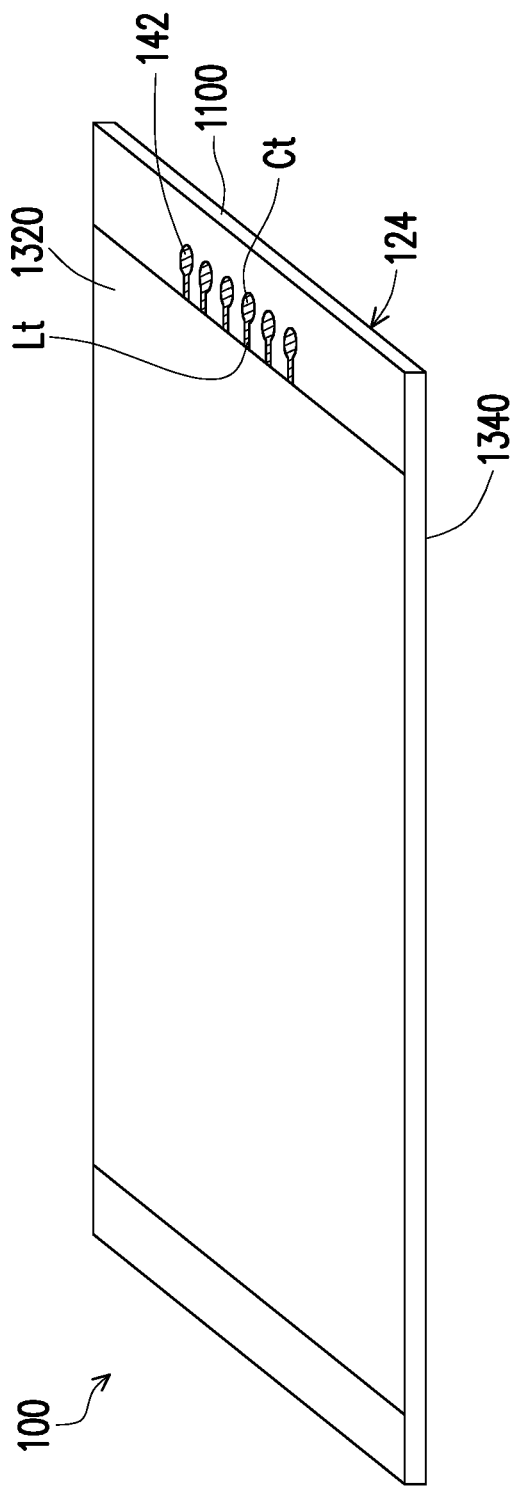
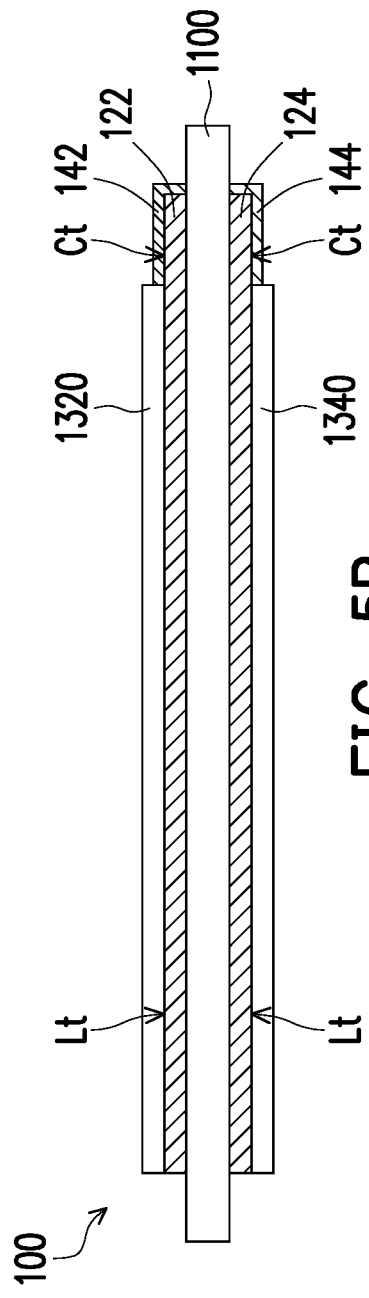
FIG. 5A
FIG. 5B

ELECTRONIC ASSEMBLY HAVING CIRCUIT CARRIER

CROSS-REFERENCE TO RELATED APPLICATION

This application is a continuation application of and claims the priority benefit of a prior application Ser. No. 17/314,048, filed on May 7, 2021, now allowed. The prior application Ser. No. 17/314,048 is a continuation application of and claims the priority benefit of a prior application Ser. No. 16/860,012, filed on Apr. 27, 2020, now patented. The prior application Ser. No. 16/860,012 is a continuation application of and claims the priority benefit of a prior application Ser. No. 16/218,489, filed on Dec. 13, 2018, now patented. The prior application Ser. No. 16/218,489 claims the priority benefit of U.S. provisional application Ser. Ser. No. 62/752,362, filed on Oct. 30, 2018. The entirety of each of the above-mentioned patent applications is hereby incorporated by reference herein and made a part of this specification.

BACKGROUND

Generally, contemporary high performance computing systems consisting of one or more electronic devices have become widely used in a variety of advanced electronic applications. In terms of the packaging used for integrated circuit components or semiconductor chips, one or more chip packages are generally bonded to a circuit carrier (e.g., a system board, a printed circuit board, or the like) for electrical connections to other external devices or electronic components.

Overall electrical performance of electronic systems is affected by each of the key components, including the performance or structure of memory devices, processing devices, input/output (I/O) devices, any associated interface elements, and the type and structure of interconnect interfaces. Existing connectors in circuit carriers have faced serious contact resistance issues due to multi-interfaces degradation. As demand for miniaturization, higher speed and better electrical performance (e.g., lower transmission loss and insertion loss) has grown recently, there has grown a need for more creative packaging and assembling techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 5B are various views showing various stages in a manufacturing method of a flexible structure, in accordance with some embodiments.

DETAILED DESCRIPTION

Figure 2A:
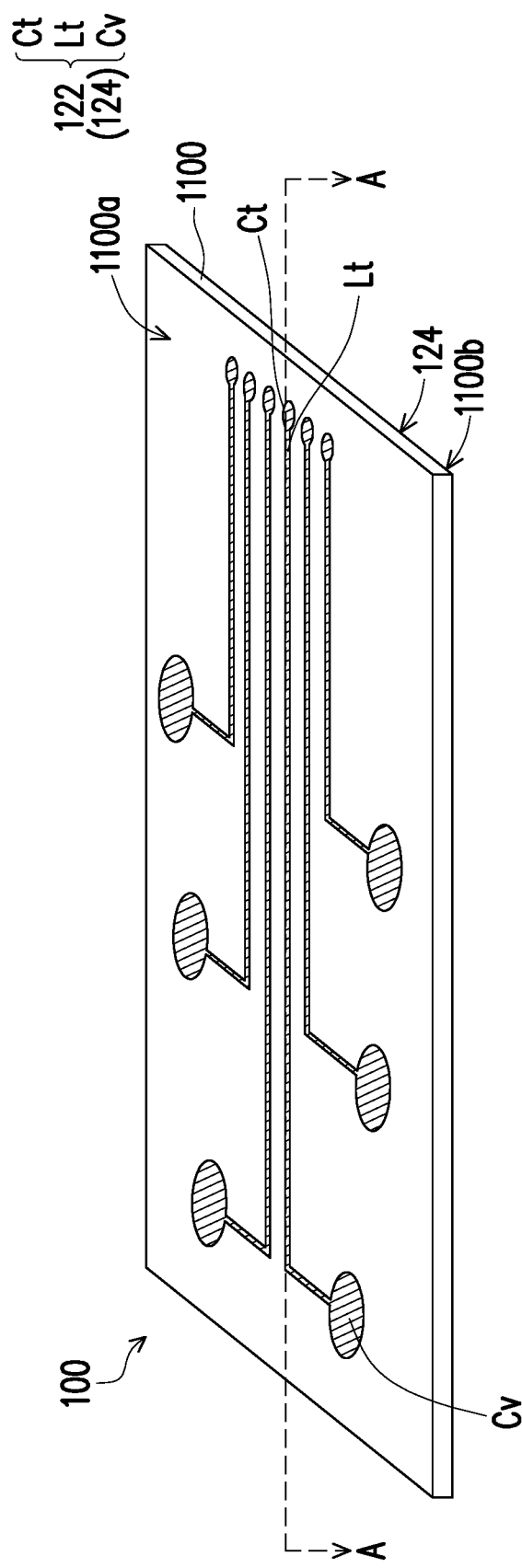

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A through 5B are various views showing various stages in a manufacturing method of a flexible structure, in accordance with some embodiments, where FIG. 1A is a schematic perspective view showing a composite structure 1000, FIG. 1B is a schematic cross-sectional view of FIG. 1A, FIGS. 2A, 3A, 4A, and 5A are perspective views illustrating the intermediate steps during a process for forming a flexible structure 100, and FIGS. 2B, 3B, 4B, and 5B are schematic cross-sectional views taken along the A-A line in FIG. 2A and illustrating intermediate steps during the corresponding process.

Referring to FIG. 1A and FIG. 1B, a composite structure 1000 is provided. For example, the composite structure 1000 includes a dielectric layer 1100 and at least one conductive layer 1220, 1240 formed thereon. The dielectric layer 1100 may include polymeric materials (e.g., polyimide (PI), benzocyclobutene (BCB), polybenzoxazole (PBO), or the like) or other suitable electrically insulating materials. In some embodiments, the dielectric layer 1100 is a resin film (e.g., a thermosetting film, a thermoplastic film) or a laminate of such flexible films. The dielectric layer 1100 may be a single film or a multi-layered film, which is not limited in the disclosure. In some embodiments, the characteristics of the dielectric layer 1100 include heat resistance, flexibility, electrical properties, and so on. The thickness the dielectric layer 1100 can be optimized for different applications, which is not limited in the disclosure. In some embodiments, the conductive layers 1220 and 1240 are formed directly on the dielectric layer 1100, and the conductive layers 1220 and 1240 are in direct contact and in physical contact with two opposite surfaces (e.g., a first surface 1100a and a second surface 1100b) of the dielectric layer 1100. The conductive layers 1220 and 1240 may be made of the same or similar conductive materials, such as copper, gold, silver, aluminum, zinc, tin, lead, combinations thereof, alloys thereof, or the like. For example, a conductive material is deposited on the first surface 1100a and the second surface 1100b of the dielectric layer 1100 using any suitable method (e.g., laminating, sputtering, plating, or the like) to respectively form the conductive layers 1220 and 1240. It should be appreciated that the conductive layers formed over double sides of the dielectric layer shown in the drawing merely serve as an exemplary illustration; however, the conductive layer may be formed on a single side of the dielectric layer depending on the design requirements.

Figure 2B:
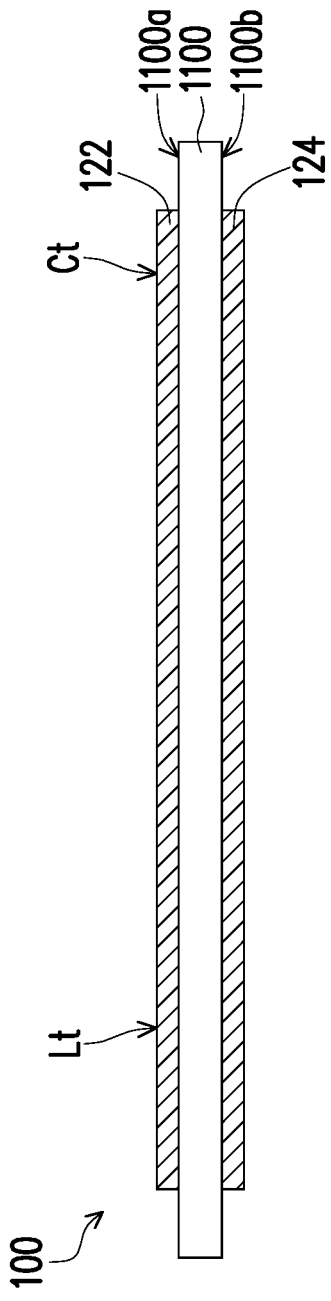
Figure 3A:
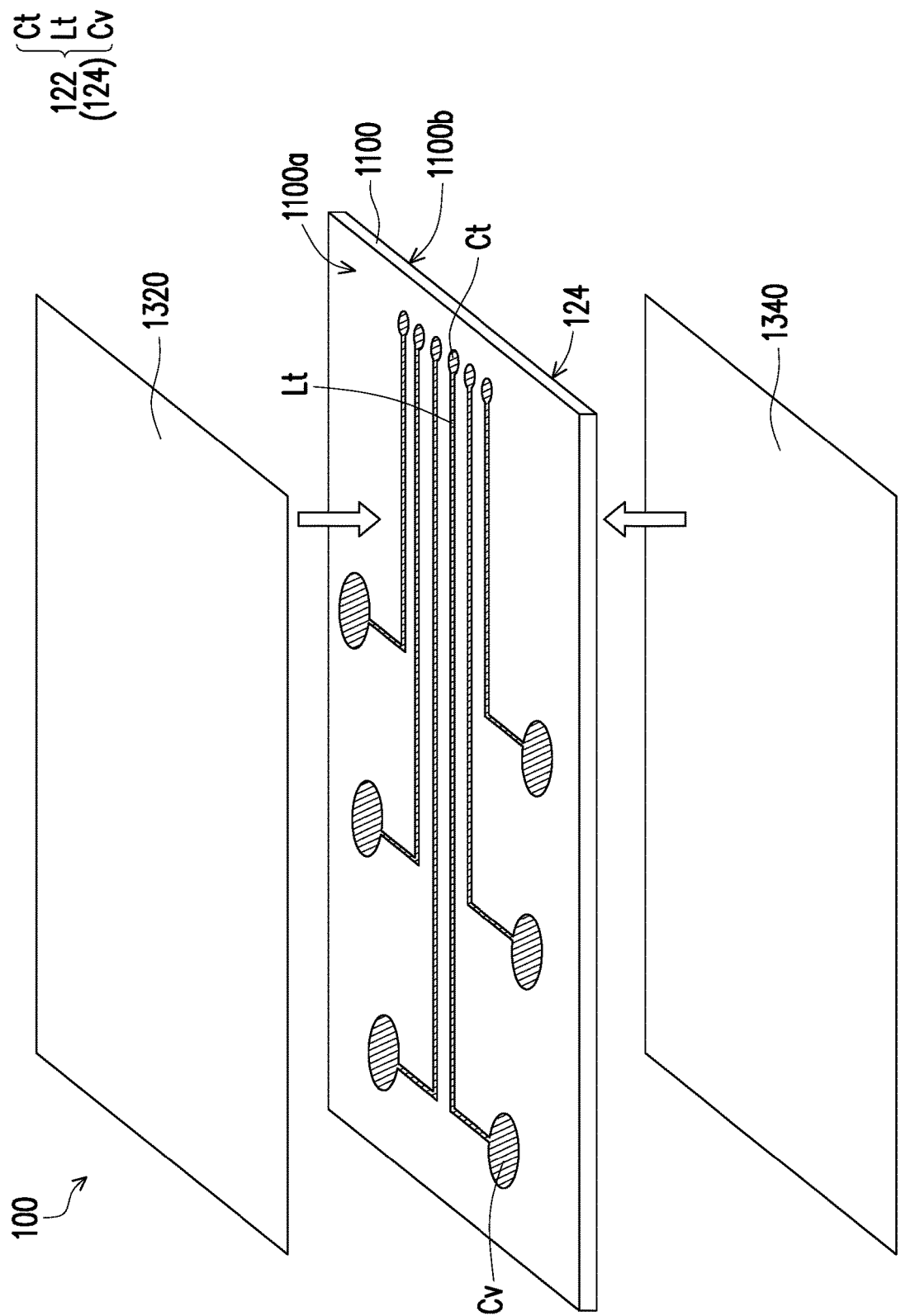
Figure 3B:
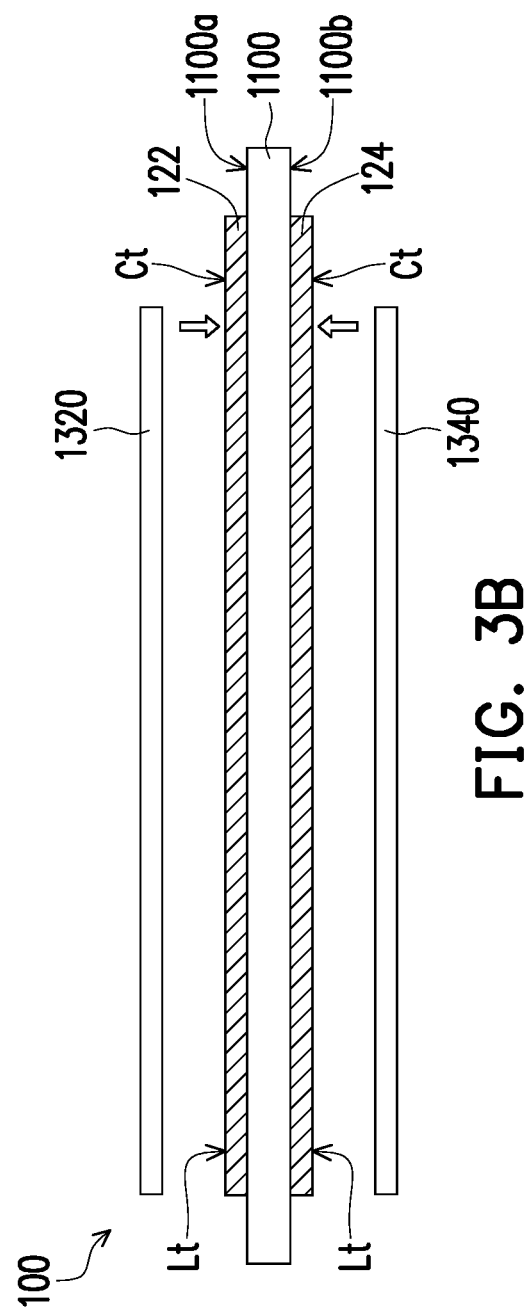
Figure 4A:
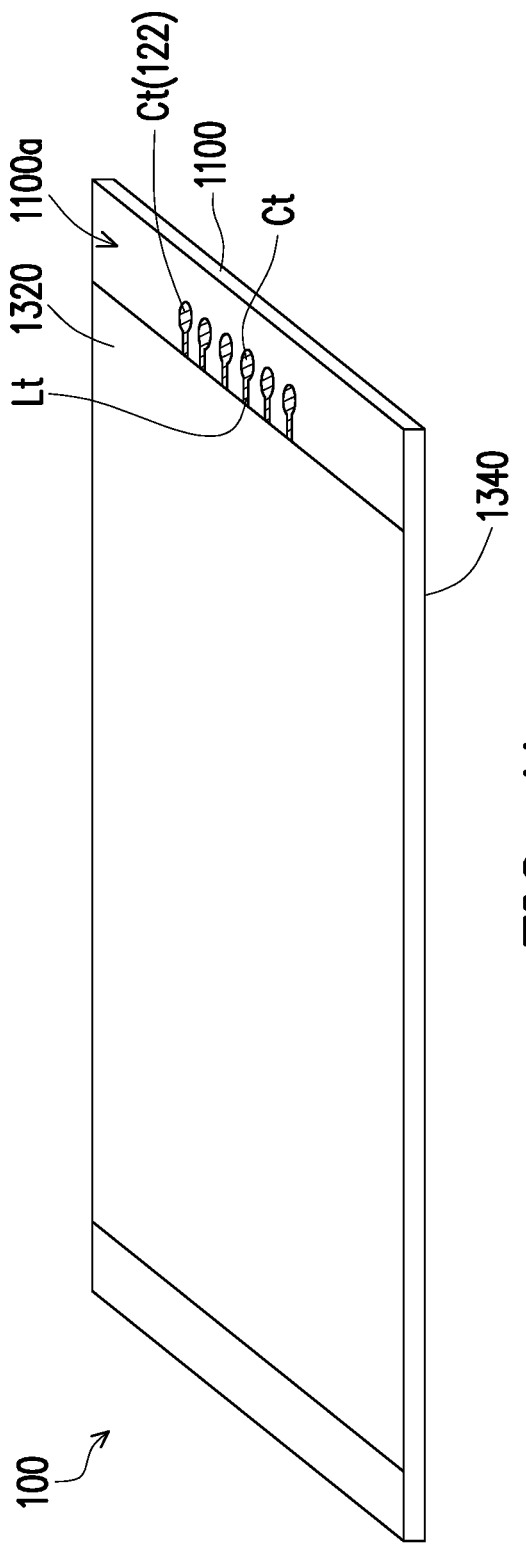
Figure 4B:
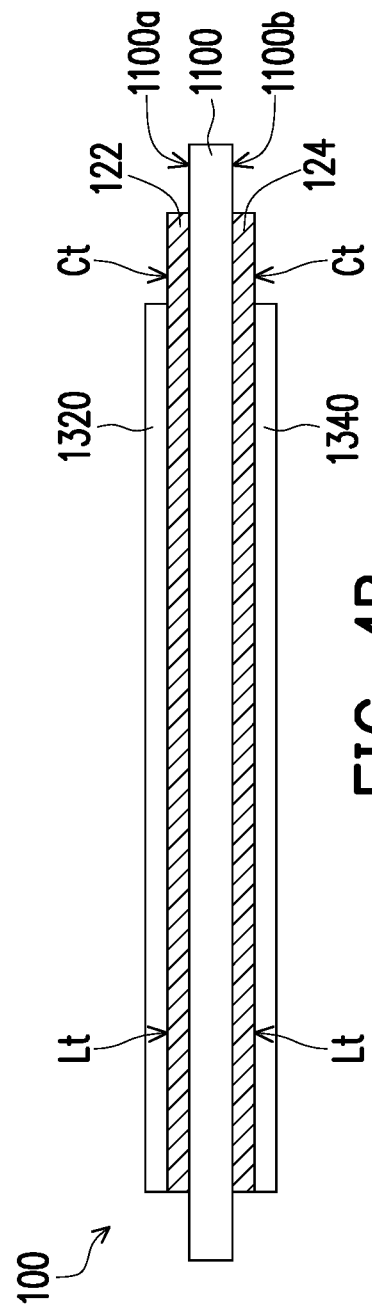

Referring to FIG. 2A and FIG. 2B, a flexible structure 100 is formed. For example, the conductive layers 1220 and 1240 of the composite structure 1000 are patterned to form conductive patterns 122 and 124 respectively. In some embodiments, at least portions of each of the conductive layers 1220 and 1240 are removed using lithography and etching processes or any suitable patterning technique to define patterns correspondingly on the first surface 1100a and the second surface 1100b of the dielectric layer 1100. For example, the lithography process may include forming a photoresist pattern (not shown) over the dielectric layer 1100 with openings which correspondingly expose the pre-determined regions of each of the conductive layers 1220 and 1240. Subsequently, the subtractive etching process, which may be conducted as a single etching step or multiple steps, may be performed to remove the uncovered conductive layers 1220 and 1240 and to form the conductive patterns 122 and 124. After patterning the conductive layers 1220 and 1240, at least a portion of the first surface 1100a and at least a portion of the second surface 1100b are respectively exposed by the conductive patterns 122 and 124.

In some embodiments, at least one of the conductive patterns 122 and 124 includes a terminal-connecting portion Ct (i.e. a peripheral portion of the conductive pattern), a trace line portion Lt connected to the terminal-connecting portion Ct, and a via-connecting portion Cv connected to the trace line portion Lt. The terminal-connecting portion Ct of the conductive pattern 122 and/or 124 may be distributed at the periphery of the dielectric layer 1100. In some embodiments, the conductive patterns 122 and 124 are symmetric with respect to the dielectric layer 1100. In alternative embodiments, the conductive pattern 122 has an asymmetrical configuration with respect to the conductive pattern 124. After formation, the flexible structure 100 may be freely foldable, thereby providing a high mounting flexibility.

Referring to FIGS. 3A, 3B and FIGS. 4A, 4B, in some embodiments, the flexible structure 100 further includes coverlay materials 1320 and 1340 respectively covering the conductive patterns 122 and 124. For example, the coverlay materials 1320 and 1340 may be formed over the first and second surfaces 1100a and 1100b of the dielectric layer 1100 to respectively cover the conductive patterns 122 and 124. For example, the coverlay materials 1320 and 1340 may be formed by deposition, lamination, spin-coating, or any suitable technique. In some embodiments, the coverlay materials 1320 and 1340 may be organic films, inorganic films, composite layers (e.g., including a polymer adhesive layer coated on a dielectric film), or other suitable insulating materials. After forming the coverlay materials 1320 and 1340, at least the terminal-connecting portions Ct of the conductive patterns 122 and 124 are exposed by the coverlay materials 1320 and 1340 for further electrical connection. The coverlay materials 1320 and 1340 may respectively cover the via-connecting portions Cv of the conductive patterns 122 and 124. In some embodiments, the coverlay materials 1320 and 1340 partially cover the trace line portions Lt of the conductive patterns 122 and 124. For example, parts of the trace line portions Lt immediately connected to the terminal-connecting portions Ct may be exposed by the coverlay materials 1320 and 1340. In some embodiments, the periphery of the dielectric layer 1100 may be exposed by the coverlay materials 1320 and 1340. For example, the coverlay material 1320 (or 1340) may expose at least two opposite margins of the first surface 1100a (or second surface 1100b) of the dielectric layer 1100.

Referring to FIG. 5A and FIG. 5B, in some embodiments, the flexible structure 100 further includes surface finish layer(s) 142/144 at least formed on the terminal-connecting portions Ct of the conductive pattern(s) 122/124, respectively. In some embodiments, the surface finish layer(s) 142/144 fully covers the exposed terminal-connecting portions Ct (e.g., including covering the sidewalls and the exposed top (bottom) surfaces of the terminal-connecting portions Ct). The surface finish layers 142 and 144 may include different materials as one or more layers, and may be used to prevent oxidation and/or improve conductivity. A material of the surface finish layers 142 and 144 may include nickel, gold, palladium, Electroless Nickel Immersion Gold (ENIG), Electroless Nickel Electroless Palladium (ENEP), Electroless Nickel Electroless Palladium Immersion Gold (ENEPIG), and/or the like. The formation of surface finish layers 142 and 144 may include immersion, plating, or the like. In some embodiments, the surface finish layers 142 and 144 and the underlying terminal-connecting portions Ct of the conductive patterns 122 and 124 are viewed as a connector for further electrical connection.

Figure 6:
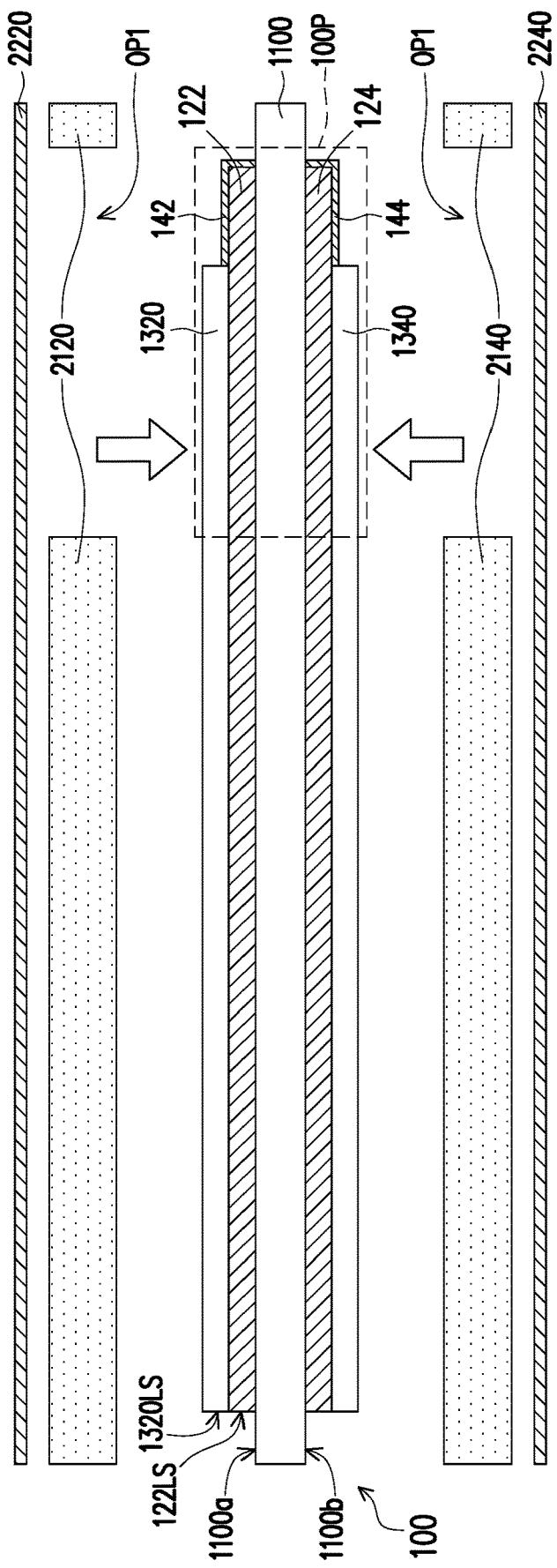
FIGS. 6 through 15 are schematic cross-sectional views showing various stages in a manufacturing method of a circuit carrier, in accordance with some embodiments.
Figure 7:
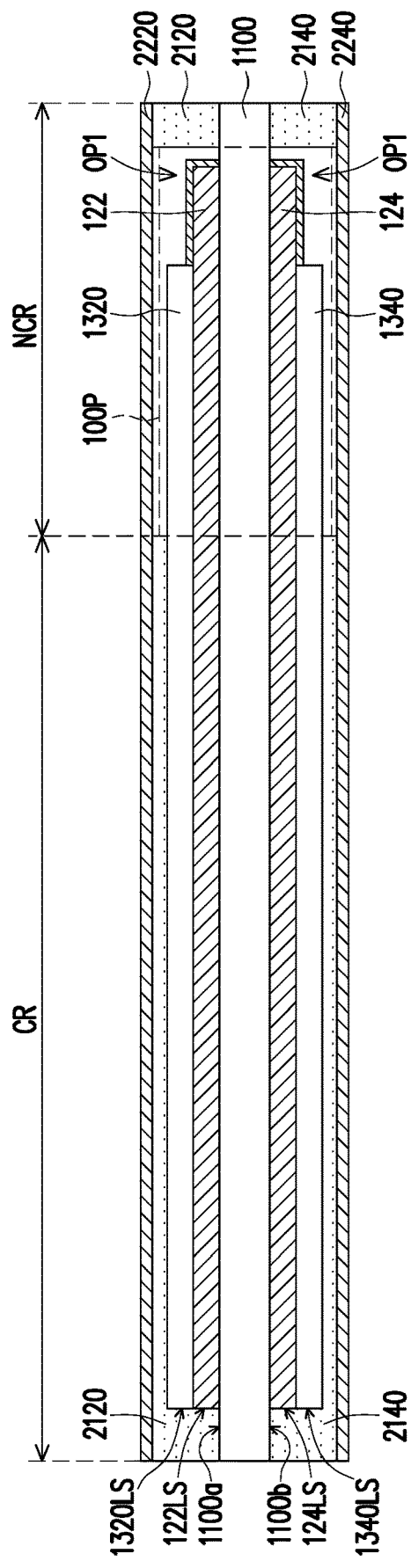

FIGS. 6 through 15 are schematic cross-sectional views showing various stages in a manufacturing method of a circuit carrier C1, in accordance with some embodiments. Referring to FIG. 6 and FIG. 7, a first pre-patterned dielectric layer (e.g., layers 2120, 2140) and a conductive material (e.g., layers 2220, 2240) are provided over one side of the flexible structure 100. For example, the first pre-patterned dielectric layers 2120 and 2140 are respectively formed over the two opposite sides of the flexible structure 100 by deposition, lamination, spin-coating, or any other suitable technique. In some embodiments, the first pre-patterned dielectric layers 2120 and 2140 are respectively formed over the coverlay materials 1320 and 1340. In some embodiments, the first pre-patterned dielectric layers 2120 and 2140 may have good depositing adhesion applied thereon. For example, the first pre-patterned dielectric layer 2120/2140 includes a prepreg sheet, a polymer layer (e.g., Ajinomoto build-up film (ABF), a polyimide film, any other suitable laminate film), and/or the like. In some embodiments, the material of the first pre-patterned dielectric layer 2120/2140 is stiffer than that of the dielectric layer 1100 of the flexible structure 100. For example, the Young's modulus of the first pre-patterned dielectric layer 2120/2140 is different from that of the dielectric layer 1100 of the flexible structure 100. In some embodiments, the Young's modulus of the first pre-patterned dielectric layer 2120/2140 is greater than the Young's modulus of the dielectric layer 1100 of the flexible structure 100. The Young's modulus of the first pre-patterned dielectric layer 2120/2140 may range from about 10 GPa to about 35 GPa. The Young's modulus of the dielectric layer 1100 of the flexible structure 100 may be in a range from 2 GPa to 10 GPa approximately.

In some embodiments, a dielectric material is patterned to form the first pre-patterned dielectric layer (e.g., layer 2120/2140) including at least one opening OP1, which may expose a peripheral region 100P of the flexible structure 100. In some embodiments, each of the first pre-patterned dielectric layers 2120 and 2140 includes a circuitry region CR and a non-circuitry region NCR connected to the circuitry region CR. For example, the openings OP1 are provided within the non-circuitry region NCR. The non-circuitry region NCR may overlap the peripheral region 100P of the flexible structure 100. In some embodiments, the location of the non-circuitry region NCR coincides with the location of the peripheral region 100P, while the span of the non-circuitry region NCR extends beyond the span of the peripheral region 100P. In some embodiments, the openings OP1 are pre-patterned (e.g., using a punching process or the like) in a suitable dielectric material prior to the disposition on the flexible structure 100. Other methods for patterning dielectric material to form the first pre-patterned dielectric layer (either before or after being disposed on the flexible structure 100) may also be employed. As referred to herein, the opening OP1 is not intended to be limited to any particular number, shape, and size. For example, the opening OP1 of the first pre-patterned dielectric layer 2120 (or 2140) can be sized to expose at least the surface finish layer 142 (or 144) of the flexible structure 100 for further electrical connection.

In some embodiments, the opening OP1 of the first pre-patterned dielectric layer 2120 (or 2140) exposes the surface finish layer 142 (or 144) and a portion of the coverlay material 1320 (or 1340) immediately adjacent to the proximal end of the surface finish layer 142 (or 144). The exposed portion of the coverlay material 1320 (or 1340) may be sized according to the design requirements. In some embodiments, the first pre-patterned dielectric layer 2120 may be thicker enough to cover a portion of the lateral surface 1320LS of the coverlay material 1320 and/or at least one lateral surface 122LS of the conductive pattern 122 and/or at least a portion of the first surface 1100a of the dielectric layer 1100. The opening OP1 of the first pre-patterned dielectric layer 2120 may expose the rest portion of the lateral surface 1320LS of the coverlay material 1320. Similarly, the first pre-patterned dielectric layer 2140 may cover a portion of the lateral surface 1340LS of the coverlay material 1340 and/or at least one lateral surface 124LS of the conductive pattern 124 and/or at least a portion of the second surface 1100b of the dielectric layer 1100. The opening OP1 of the first pre-patterned dielectric layer 2140 may expose the rest portion of the lateral surface 1340LS of the coverlay material 1340.

In some embodiments, the conductive material (e.g., 2220, 2240) is laminated on two opposing surfaces of the first pre-patterned dielectric layer 2120/2140 to sandwich the flexible structure 100 therein. The conductive materials 2220 and 2240 may be respectively formed over the first pre-patterned dielectric layers 2120 and 2140 to cover the circuitry region CR and the non-circuitry region NCR. In some embodiments, the first pre-patterned dielectric layer 2120 (or 2140) and the overlying conductive material 2220 (or 2240) are formed over the flexible structure 100 during the same process. In some embodiments, the conductive materials 2220 and 2240 are metal foils and may be laminated on the first pre-patterned dielectric layers 2120 and 2140, respectively. In alternative embodiments, the conductive materials 2220 and 2240 are respectively deposited over the first pre-patterned dielectric layers 2120 and 2140 using any suitable technique (e.g., chemical vapor deposition (CVD), sputtering, printing, plating, or the like). Examples of conductive materials 2220 and 2240 are copper, tungsten, aluminum, silver, gold, a combination thereof, and/or the like. In some embodiments, after forming the conductive materials 2220 and 2240, the conductive materials 2220 and 2240 respectively cover the openings OP1 in the non-circuitry regions NCR of the first pre-patterned dielectric layers 2120 and 2140. At this stage, the surface finish layers 142 and 144 of the flexible structure 100 may be shielded by the conductive materials 2220 and 2240. In some embodiments, the portions of the conductive materials 2220 and 2240 covering the openings OP1 may be spatially apart from the flexible structure 100. That is, a confined space is formed and enclosed by the conductive material 2220 (or 2240), the first pre-patterned dielectric layer 2120 (or 2140), and the flexible structure 100.

Figure 8:
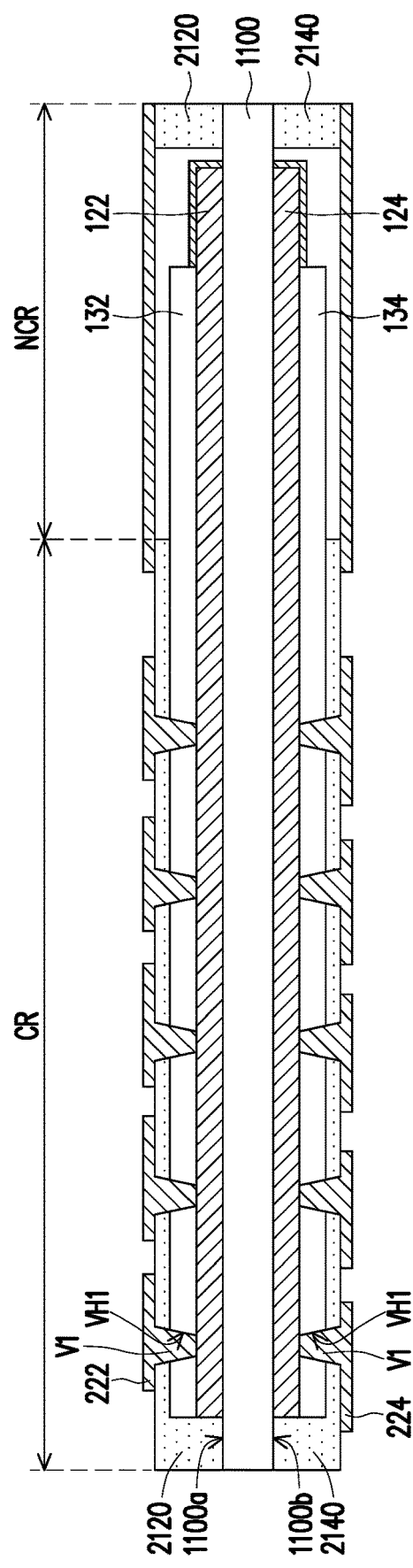

Referring to FIG. 8, a first patterned conductive layer(s) 222/224 may be formed on the first pre-patterned dielectric layer(s) 2120/2140 to electrically connect the conductive pattern(s) 122/124. In some embodiments, formations of the first patterned conductive layer(s) 222/224 may be based on an additive process or a semi-additive process, depending on the manufacturing process. For example, first via hole(s) VH1 at the predetermined position(s) (e.g., corresponding to the circuitry region CR) are formed by removing portions of the conductive material 2220 (or 2240), the underlying first pre-patterned dielectric layer 2120 (or 2140), the underlying coverlay material 1320 (or 1340) through laser drilling, etching, a combination thereof, or other suitable removal techniques. After removing portions of the coverlay material 1320 (or 1340), a coverlay layer 132 (or 134) is formed.

In some embodiments, the first via holes VH1 may expose the via-connecting portions Cv (shown in FIG. 2A) of the conductive pattern(s) 122/124. Next, an additional conductive material (not shown) may be formed inside the first via holes VH1 so as to form first conductive via(s) V1. In some embodiments, the first via holes VH1 are substantially filled up by the additional conductive material. The additional conductive material may also be formed over the remaining portions of the conductive material(s) 2220/2240, thus increasing the thicknesses of the remaining portions of the conductive material(s) 2220/2240. In some embodiments, the additional conductive material is formed by, for example, plating, sputtering, or other suitable deposition techniques. For example, the first conductive vias V1 are in physical and electrical contact with the conductive pattern(s) 122/124 such as the via-connecting portions Cv. In some embodiments, the coverlay layer 132 (or 134) laterally encapsulates each of the bottom portions of the first conductive vias V1. Each of the top portions of the first conductive vias V1 may be laterally encapsulated by the first pre-patterned dielectric layer 2120 (or 2140). Next, the remaining conductive material(s) 2220/2240 and the overlying additional conductive materials are patterned using, for example, lithography and etching process or other suitable processes, thereby providing the first patterned conductive layer(s) 222/224.

After formation, those first conductive vias V1 at the same side with the first surface 1100a are in electrical and physical contact with the conductive pattern 122 and the first patterned conductive layer 222. Similarly, those first conductive vias V1 at the same side with the second surface 1100b are in electrical and physical contact with the conductive pattern 124 and the first patterned conductive layer 224. In some other embodiments, the conductive material(s) 2220/2240 may be subjected to a subtractive process so as to form the patterned conductive layer(s) 222/224. Other circuit formation methods may be used to form the first patterned conductive layer(s) 222/224.

Figure 9:
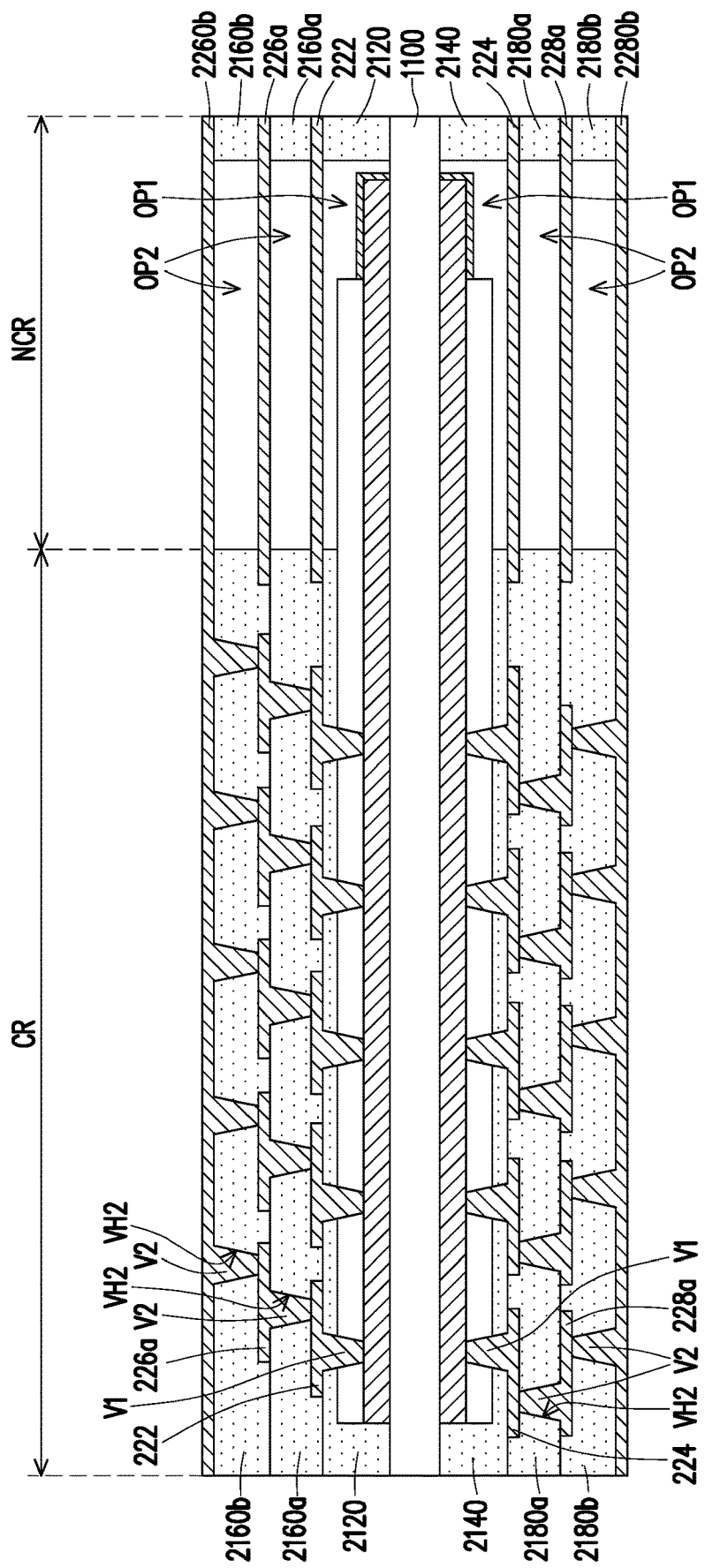

Referring to FIG. 9, a second pre-patterned dielectric layer(s) 2160a/2180a (along with 2160b/2180b in some embodiments) may be optionally formed over the first pre-patterned dielectric layer(s) 2120/2140. In some embodiments, second patterned conductive layer(s) 226a/228a may be formed over the second pre-patterned dielectric layer(s) 2160a/2160b/2180a/2180b to be electrically connected to the first patterned conductive layer(s) 222/224. For example, the second pre-patterned dielectric layers 2160a and 2180a and the overlying conductive materials are respectively laminated onto the first pre-patterned dielectric layers 2120 and 2140 (or use other suitable deposition process) to correspondingly cover the first patterned conductive layers 222 and 224. In some embodiments, the second pre-patterned dielectric layer(s) 2160a/2180a may be provided with the opening(s) OP2 in the non-circuitry regions NCR. For example, the opening(s) OP2 may be substantially aligned with the opening(s) OP1 of the first pre-patterned dielectric layer(s) 2120/2140. In some embodiments, the opening(s) OP2 in the non-circuitry regions NCR of the second pre-patterned dielectric layer 2160a (or 2180a) may be shielded by the conductive material(s) formed on the second pre-patterned dielectric layer 2160a (or 2180a). Those portions of conductive materials covering the opening(s) OP2 of the second pre-patterned dielectric layer(s) 2160a/2160b/2180a/2180b in the non-circuitry regions NCR may be spatially apart from the underlying portion of the conductive material shielding the opening(s) OP1 of the first pre-patterned dielectric layer(s) 2120/2140. In some embodiments, a multi-layered space is formed corresponding to the non-circuitry region NCR and each layer of the space is separated by these layers of the conductive materials.

Next, the second via hole(s) VH2 may be formed in the second pre-patterned dielectric layer 2160a (or 2180a) and the overlying conductive material(s) corresponding to the circuitry region CR so as to reach the underlying first patterned conductive layer 222 (or 224) at the predetermined position(s). Subsequently, additional conductive material(s) may be formed and patterned on the remaining portions of the conductive materials in the similar manner as described above so as to form the second patterned conductive layer(s) 226a/228a. In some other embodiments, the second pre-patterned dielectric layer(s) 2160a/2180a may be provided with the opening(s) OP2 in the non-circuitry region NCR and the second via hole(s) VH2 in the circuitry region CR, and after laminating the second pre-patterned dielectric layer(s) 2160a/2180a, conductive material(s) may be deposited inside the second via hole(s) VH2 and extend onto the surface of the second pre-patterned dielectric layer(s) 2160a/2180a to respectively form the second conductive via(s) V2 and the second patterned conductive layer(s) 226a/228a.

In some embodiments, the first patterned conductive layers 222 and 224 (and/or the second patterned conductive layers 226a and 228a) are symmetric with respect to the dielectric layer 1100. In alternative embodiments, the first patterned conductive layer 222 (and/or the second patterned conductive layer 226a) has an asymmetrical configuration with respect to the first patterned conductive layer 224 (and/or the second patterned conductive layer 228a). In some embodiments, the abovementioned steps may be performed multiple times (e.g., formation of prepatterned dielectric layers 2160b/2180b) to obtain a multi-layered circuit structure as required by the circuit design. Afterwards, a conductive material(s) 2260b/2280b may be formed over the outermost second pre-patterned dielectric layer(s) 2160b/2180b to be in physical contact with the second conductive vias V2 as shown in FIG. 9.

Figure 10:
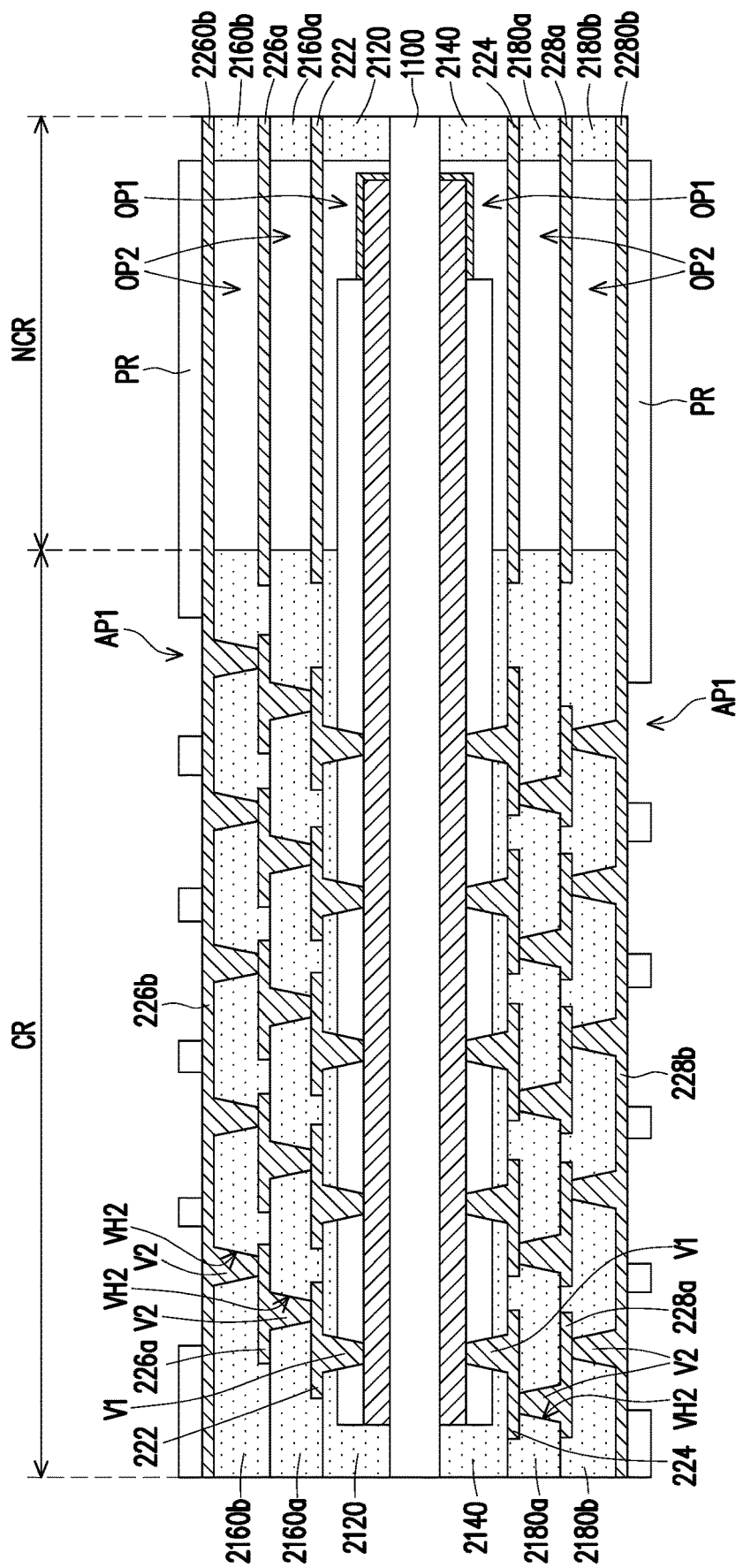
Figure 11:
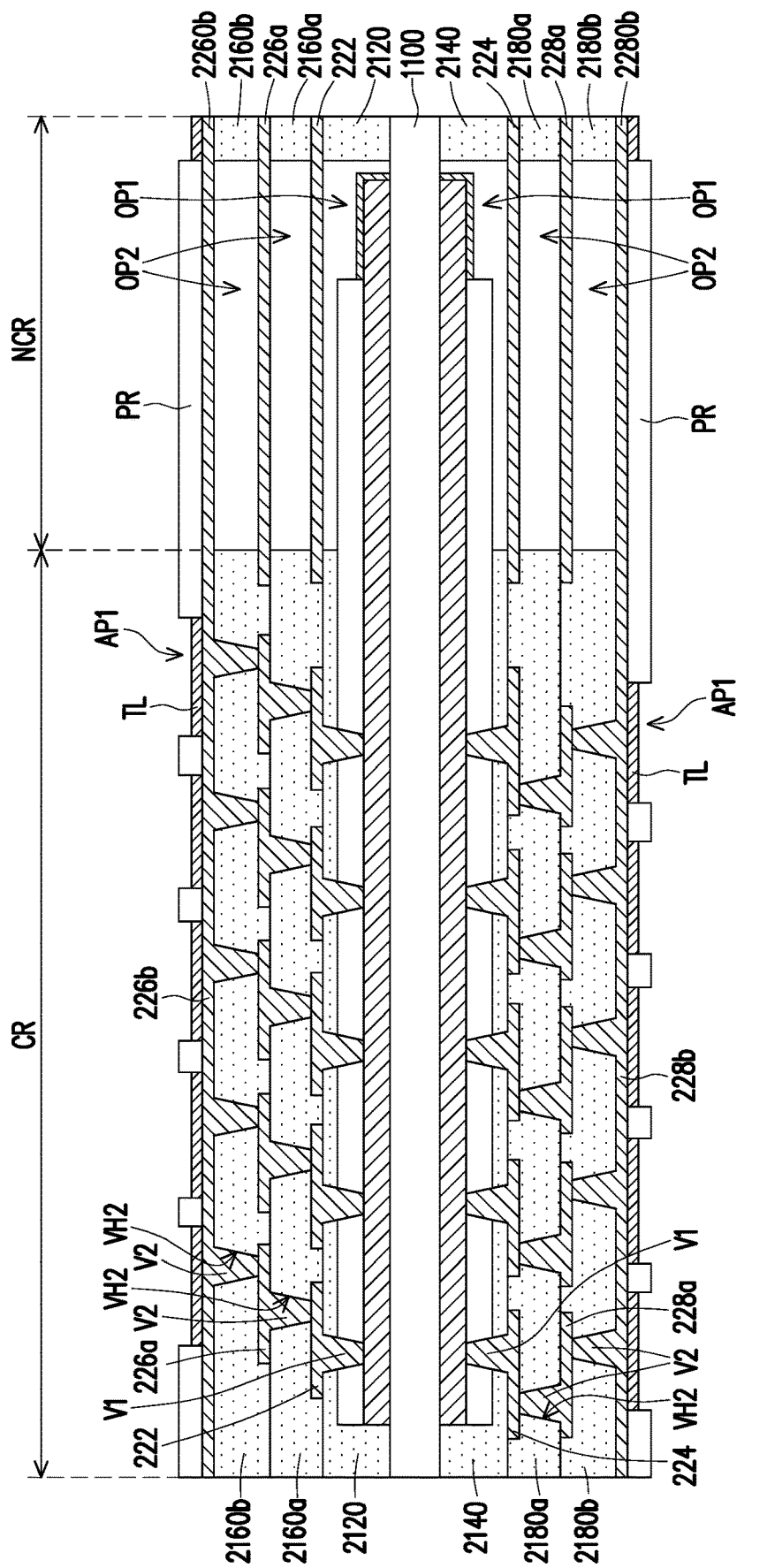

Referring to FIG. 10 and FIG. 11, a sacrificial mask layer(s) PR including aperture(s) AP1 may be formed over the conductive material(s) 2260b/2280b. For example, the apertures AP1 of the sacrificial mask layers PR may correspond to the circuitry region CR. In some embodiments, the apertures AP1 expose at least a portion of the underlying conductive material(s) 2260b/2280b at the predetermined positions. In some embodiments, the sacrificial mask layers PR cover those portions of conductive material(s) 2260b/2280b shielding the opening(s) OP2 in the non-circuitry region NCR. The sacrificial mask layer PR may include photoresist material, dry film polymer dielectrics, other sacrificial film materials, or any suitable dielectric material. Next, sacrificial conductive pattern(s) TL may be formed in the apertures AP1 of the sacrificial mask layers PR to be in direct contact with the underlying conductive material(s) 2260b/2280b. A material of the sacrificial conductive pattern TL may be different from that of the underlying conductive material 2260b, 2280b. The sacrificial conductive pattern TL may be made of tin, tin-lead alloy, or other suitable conductive materials. In some embodiments, the sacrificial conductive pattern TL may serve as an etch resist in the subsequent etching step. The sacrificial mask layer PR and the sacrificial conductive pattern TL may be considered sacrificial in the sense that they may be ultimately removed, according to some embodiments.

Figure 12:
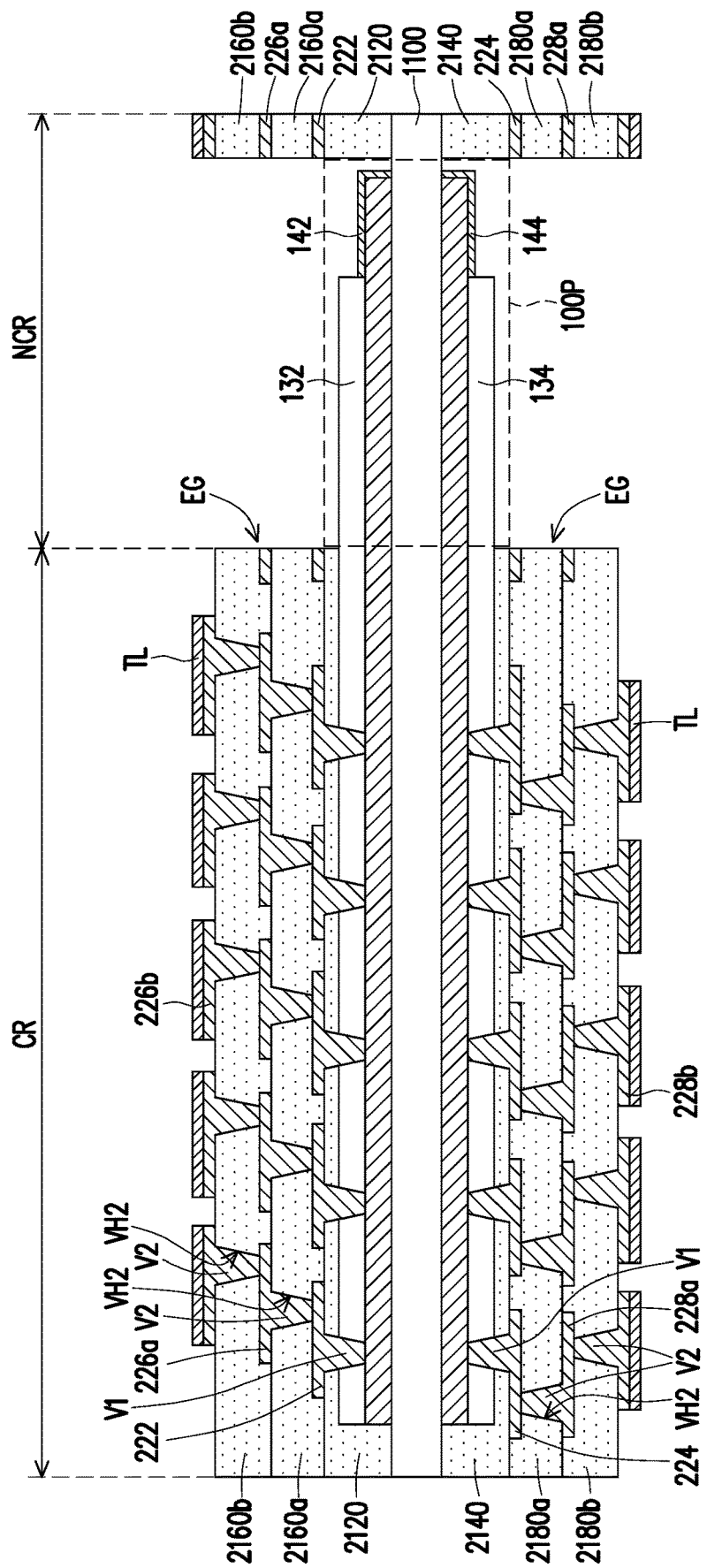
Figure 13:
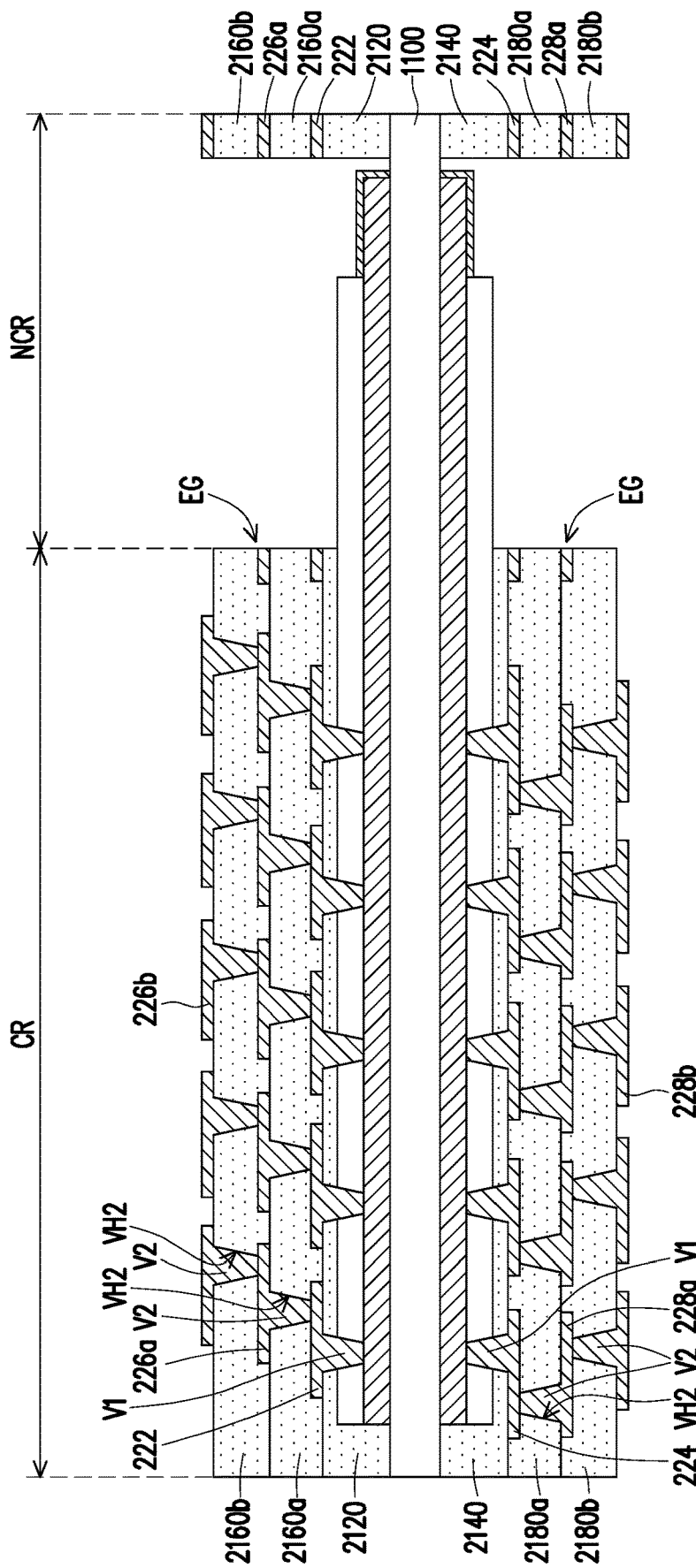

Referring to FIGS. 11, 12 and 13, after forming the sacrificial conductive pattern TL, the sacrificial mask layer PR may be removed to expose portions of the underlying conductive material(s) 2260b/2280b unmasked by the sacrificial conductive pattern TL. For example, the sacrificial mask layer PR may be stripped away using suitable stripping solutions tailored for particular photoresists. In some other embodiments, the sacrificial mask layer PR may be dissolved in suitable solvent or etched using wet chemistry with an appropriate chemical solution, plasma etching, and/or the like. In some embodiments, after removing the sacrificial mask layer PR, the exposed portions of the conductive materials 2260b and 2280b (e.g., unmasked by the sacrificial conductive patterns TL) corresponding to both of the circuitry region CR and the non-circuitry region NCR are removed by, such as etching or other suitable selective removal techniques, to expose the outermost second pre-patterned dielectric layers 2160b and 2180b and to expose the peripheral region 100P of the flexible structure 100 (layers 132/134 and 142/144).

In certain embodiments in which the sacrificial mask layers PR are formed on the portions of the conductive materials 2260b and 2280b (e.g., shielding the openings OP2), those portions of the conductive materials 2260b and 2280b corresponding to the non-circuitry region NCR, the underlying portions of the second patterned conductive layers 226a and 228a (e.g., shielding the openings OP2), and the underlying portions of the first patterned conductive layers 222 and 224 (e.g., shielding the openings OP1) are removed during the same removal process such that an edge EG of the circuit stack is formed. For example, edges of the first pre-patterned dielectric layers 2120, 2140, the overlying first patterned conductive layers 222, 224, the overlying second pre-patterned dielectric layer(s) 2160a/2160b/2180a/2180b, and the overlying second patterned conductive layer(s) 226a/226b/228a/228b may be substantially aligned. Subsequently, as shown in FIG. 13, the sacrificial conductive pattern TL may be removed using, such as stripping, etching, or other suitable selective removal process, to form the outermost second patterned conductive layer(s) 226b/228b.

Figure 14:
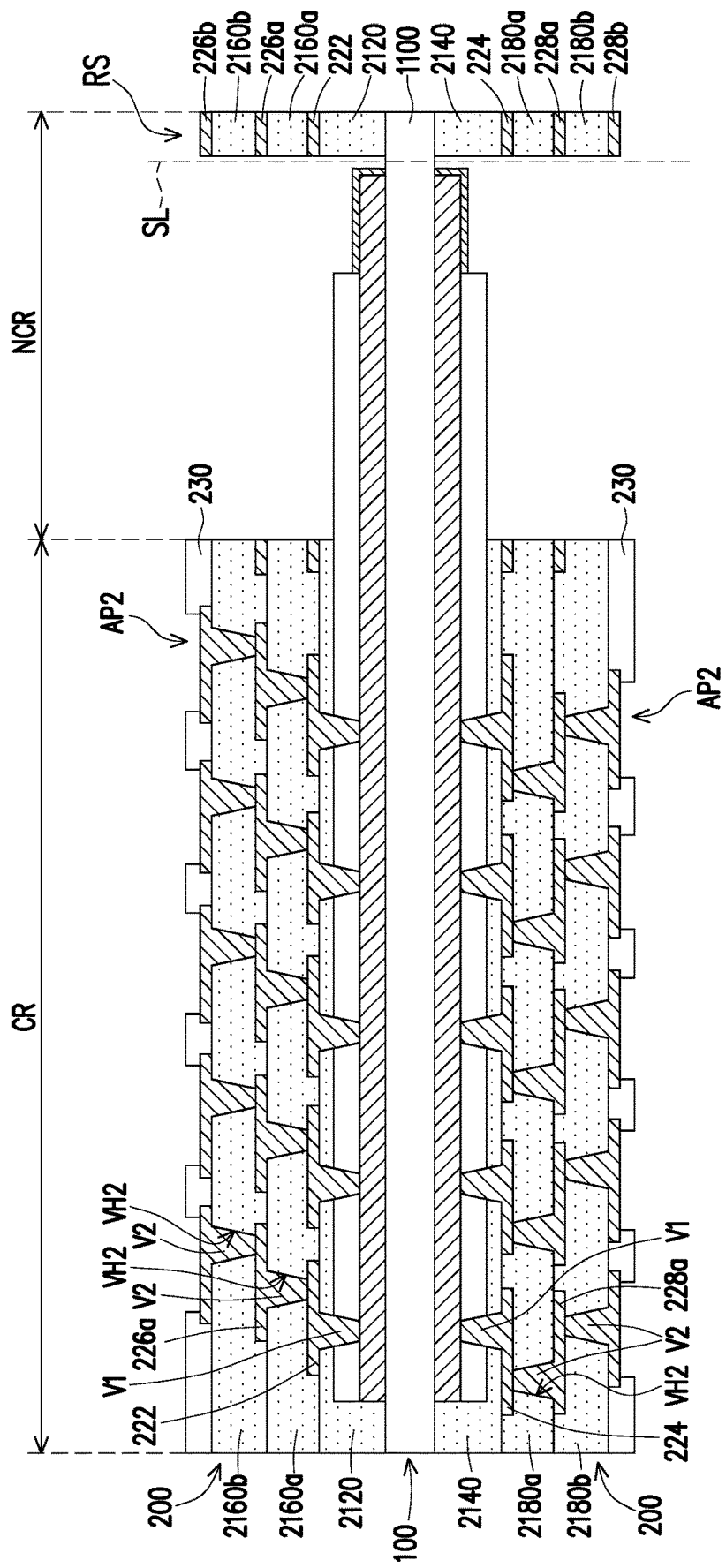
Figure 15:
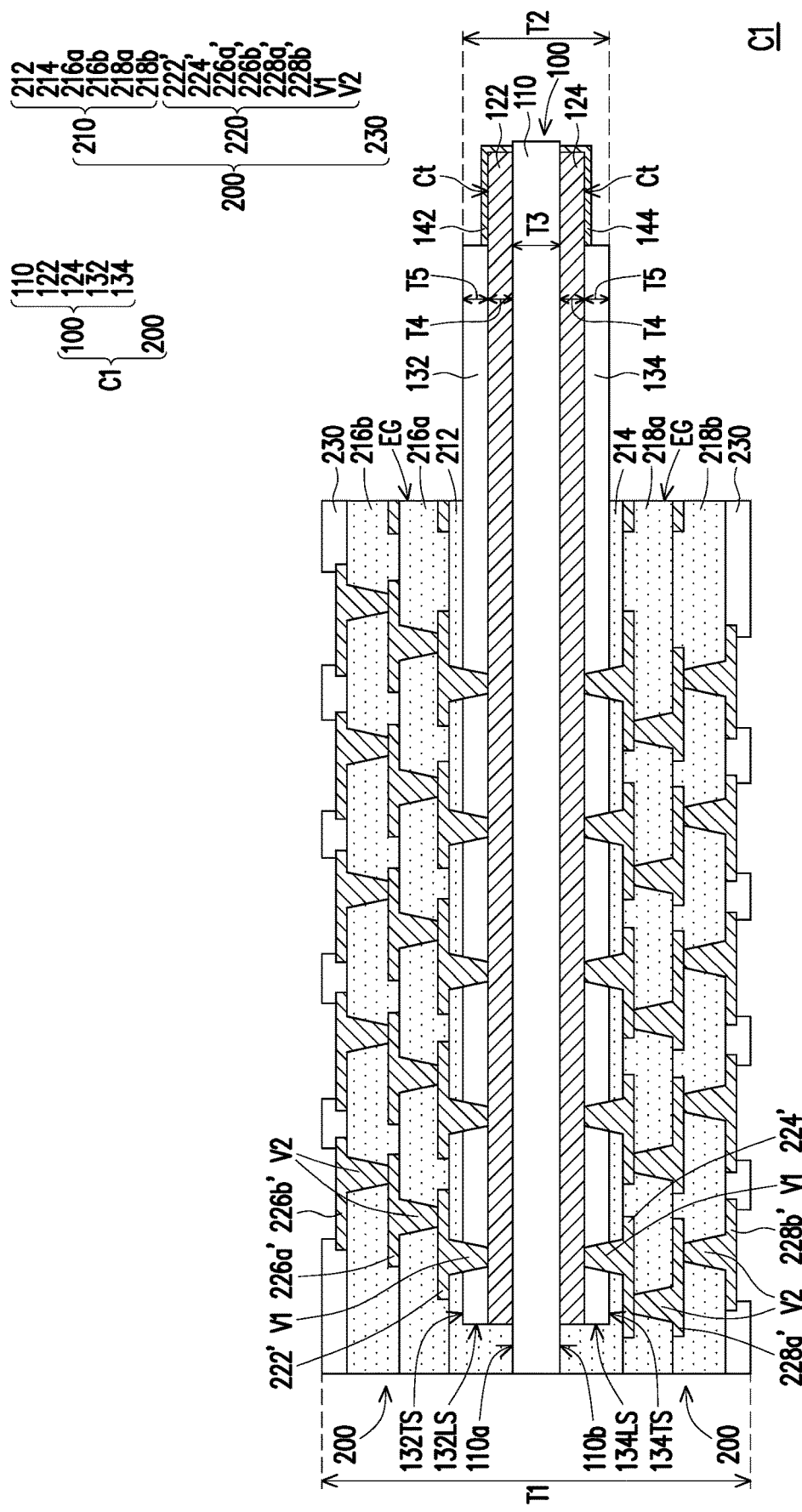

Referring to FIG. 14 and FIG. 15, patterned mask layer(s) 230 may be formed over the outermost second pre-patterned dielectric layer(s) 2160b/2180b corresponding to the circuitry region CR such that a circuit structure 200 with the flexible structure 100 sandwiched therein is formed. It should be appreciated that the circuit structure 200 formed over double sides of the flexible structure shown in the drawings merely serves as an exemplary illustration; however, the circuit structure 200 may be formed on a single side of the flexible structure depending on the design requirements.

In some embodiments, the patterned mask layer 230 may protect the underlying circuitry. For example, the patterned mask layer 230 includes aperture(s) AP2 exposing at least a portion of the outermost second patterned conductive layer(s) 226b/228b. The patterned mask layer 230 may be made of polymeric materials, or other suitable insulating materials. In some embodiments, the patterned mask layer 230 may be formed of materials having a chemical composition of silica, barium sulfate and epoxy resin, and/or the like. For example, the material of the patterned mask layer 230 serving as a solder mask may be selected to withstand the temperatures of molten conductive materials (e.g., solders, metals, and/or metal alloys) to be subsequently disposed within aperture(s) AP2.

In some embodiments, a redundant stack RS (e.g., the dielectric layer 1100 of the flexible structure 100, the overlying first pre-patterned dielectric layers 2120, 2140, the overlying first patterned conductive layer 222, 224, the overlying second pre-patterned dielectric layers 2160a, 2160b, 2180a, 2180b, and the overlying second patterned conductive layers 226a, 226b, 228a, 228b) at the periphery corresponding to the non-circuitry region NCR may be cut off along a scribed line SL so as to form a circuit carrier C1 as shown in FIG. 15. That is, the structures formed corresponding to the circuitry region CR are remained on the flexible structure 100.

The circuit carrier C1 may be configured to connect an electronic device as will be described later herein. In some embodiments, the thickness T1 of the circuit carrier C1 ranges from about 50 μm to about 8000 μm. As shown in FIG. 15, the circuit carrier C1 includes the circuit structure 200 and the flexible structure 100 interposed in the circuit structure 200, thereby improving folding endurance and flexural properties while maintaining rigidity and reliability of the circuit carrier C1. A portion 100P (as shown in FIG. 12; including the terminal-connecting portion Ct) of the flexible structure 100 is configured to extend out from an edge EG of the circuit structure 200 so as to be in contact with a subsequently mounted electronic device.

For example, the flexible structure 100 includes a first dielectric layer 110 (e.g., the remaining dielectric layer 1100), the conductive pattern(s) 122/124 disposed on the first dielectric layer 110. The thickness T2 of the flexible structure 100 may range from about 25 μm to about 300 μm. In some embodiments, the thickness T3 of the first dielectric layer 110 may range from about 5 μm to about 50 μm. In some embodiment, the thickness T4 of the conductive pattern(s) 122/124 ranges from about 5 μm to about 30 μm. The circuit structure 200 electrically connected to the conductive pattern(s) 122/124 may include a second dielectric layer 210 and a circuit layer 220. The circuit layer 220 may be disposed on and extending into the second dielectric layer 210 so as to be in physical and electrical contact with the conductive pattern(s) 122/124. The material of the second dielectric layer 210 may be different from that of the first dielectric layer 110 of the flexible structure 100. For example, the Young's modulus of the second dielectric layer 210 is greater than that of the first dielectric layer 110 so that the second dielectric layer 210 may provide a mechanical rigidity of the circuit carrier C1 and the first dielectric layer 110 may provide a mounting flexibility of the circuit carrier C1.

For example, a plurality of sublayers including the remaining first pre-patterned dielectric layer(s) 212/214 and the remaining second pre-patterned dielectric layer(s) 216a/216b/218a/218b may be collectively viewed as the second dielectric layer 210. In some embodiments, the thickness of one of the sublayer of the second dielectric layer 210 may range from about 5 μm to about 100 μm. For example, the sublayer(s) of the remaining first patterned conductive layer(s) 222'/224', the remaining second patterned conductive layer(s) 226a'/226b'/228a'/228b', the first conductive via(s) V1, and the second conductive via(s) V2 may be collectively viewed as the circuit layer 220. In some embodiments, the thickness of one of the sublayer of the circuit layer 220 may range from about 5 μm to about 100 μm.

In some embodiments, the flexible structure 100 includes coverlay layer(s) 132/134 disposed between the conductive pattern(s) 122/124 and the second dielectric layer 210 of the circuit structure 200, where at least a portion of the circuit layer 220 (e.g., first conductive vias V1) penetrates through the coverlay layer(s) 132/134 to be in contact with the conductive pattern(s) 122/124. In some embodiments, the thickness T5 of the coverlay layer(s) 132/134 ranges from about 5 μm to about 50 μm. For example, the second dielectric layer 210 of the circuit structure 200 covers a portion of the lateral surface(s) 132LS/134LS of the coverlay layer(s) 132/134 and a portion of the top surface(s) 132TS/134TS which is connected to the lateral surface(s) 132LS/134LS of the coverlay layer(s) 132/134. The second dielectric layer 210 of the circuit structure 200 may expose the other portion of the lateral surface(s) 132LS/134LS of the coverlay layer(s) 132/134 and the other portion of the top surface(s) 132TS/134TS of the coverlay layer(s) 132/134. In some embodiments, the second dielectric layer 210 of the circuit structure 200 is in physical contact with a surface (e.g., first surface 110a, second surface 110b) of the first dielectric layer 110 where the conductive pattern(s) 122/124 is formed thereon, as can be seen in FIG. 15 around the left side edge of the circuit structure 200. In some embodiments, the flexible structure 100 includes the surface finish layer(s) 142/144 disposed on the portion (e.g., terminal-connecting portion Ct) of the conductive pattern(s) 122/124 of the flexible structure 100 extended out from the edge EG of the circuit structure 200. In some embodiments, the circuit carrier C1 includes a patterned mask layer 230 disposed on the circuit layer 220 (e.g., the remaining outermost second patterned conductive layers 226b', 228b') and exposing at least a portion of the circuit layer 220.

Figure 16:
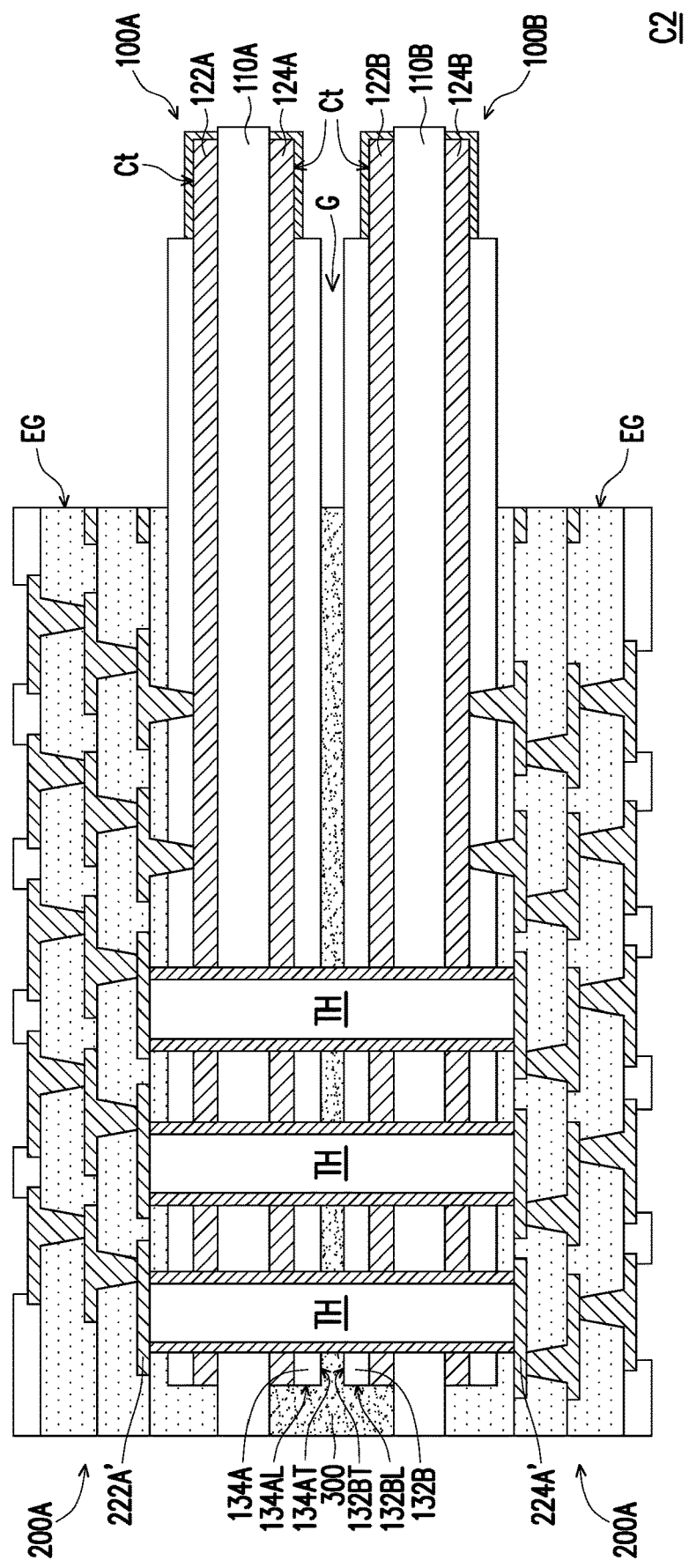
FIG. 16 is a schematic cross-sectional view showing a circuit carrier, in accordance with some embodiments.

FIG. 16 is a schematic cross-sectional view showing a circuit carrier C2, in accordance with some embodiments. Referring to FIG. 16, the circuit carrier C2 includes the circuit structure 200A, more than one flexible structure (e.g., 100A, 100B) interposed inside the circuit structure 200A, and at least one conductive through hole TH penetrating through the flexible structures 100A and 100B so as to be in physical and electrical contact with the circuit structure 200A. Each of the flexible structures 100A and 100B may be similar to the flexible structure 100 described above. The flexible structures 100A and 100B may be electrically connected to form a vertical stacked-up configuration. In some alternative embodiments, a plurality of flexible structures (e.g., 100A and 100B) may be oriented parallel to and disposed over one another.

In some embodiments, the flexible structures 100A and 100B are bonded through a bonding layer 300. In some embodiments, the bonding layer 300 is disposed between the coverlay layer 134A of the flexible structure 100A and the coverlay layer 132B of the flexible structures 100B. The bonding layer 300 may cover the lateral surface(s) 134AL/132BL and the top surface(s) 134AT/132BT of the coverlay layer(s) 134A/132B and may also cover the surfaces of the first dielectric layers 110A and 110B facing towards each other. A material of the bonding layer 300 may include polyimide (PI), polypropylene (PP), other suitable polymeric materials, or suitable bonding materials. In some embodiments, the edges of the bonding layer 300 may be vertically aligned to the respective edges EG of the circuit structure 200A. In some embodiments, the bonding layer 300 is bonding the regions of the flexible structures 100A and 100B where the circuit structure 200A is formed on, and a gap G may be formed between the flexible structures 100A and 100B at the region of the flexible structures 100A and 100B extending out from the edge EG of the circuit structure 200A. In some embodiments, the gap G is airgap.

In some embodiments, the conductive through hole(s) TH may be laterally encapsulated by the flexible structures 100A and 100B. The bonding layer 300 may be in electrical and physical contact with the conductive pattern(s) 122A/124A/122B/124B of the flexible structures 100A and 100B. The conductive through hole(s) TH may pass through both of the flexible structures 100A and 100B to be in electrical and physical contact with the first patterned conductive layer(s) 222A'/224A' of the circuit structure 200A. That is, the conductive through hole(s) TH passing through the flexible structures 100A and 100B may provide electrical paths between the circuit layers of the circuit structure 200A and the conductive patterns of the flexible structures 100A and 100B.

For example, after bonding the flexible structures 100A and 100B and the formation of the first pre-patterned dielectric layer(s) (e.g., dielectric layer 2120, 2140 shown in FIG. 7) and the conductive material(s) (e.g., conductive material 2220, 2240 shown in FIG. 7), through hole(s) (not shown) may be formed at the predetermined positions by, for example, mechanical or laser drilling, etching, or other suitable removal techniques. Next, the through hole(s) may be plated with conductive materials (e.g., copper) to a predetermined thickness, thereby providing the conductive through hole(s) TH. It should be noted that the foregoing sequence merely serves as an illustrative example. As referred to herein, the conductive through hole(s) TH is not intended to be limited to any particular type of electrically conductive material or any particular method of fabrication. The conductive through hole(s) TH may be solid or hollow, but not limited in the disclosure. In certain embodiments in which the conductive through hole(s) TH is hollow, an insulating layer may be formed therein. The portion (e.g., terminal-connecting portion Ct) of each flexible structure (e.g., structure 100A, 100B) extending out from the edge EG of the circuit structure 200A and stacked upon one another are oriented in the same direction or may face toward different directions for external electrical connection. Accordingly, the integration of an electronic assembly may be improved and the insertion loss (and/or return loss) causing by multi-connecting interfaces may be eliminated.

Figure 18:
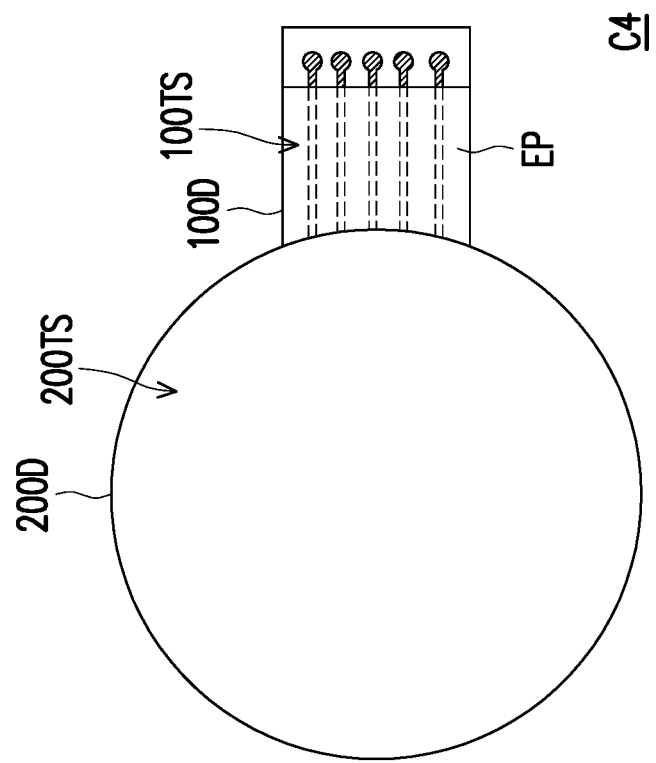
FIGS. 17 and 18 are schematic plan views showing different types of circuit carriers, in accordance with some embodiments.
Figure 17:
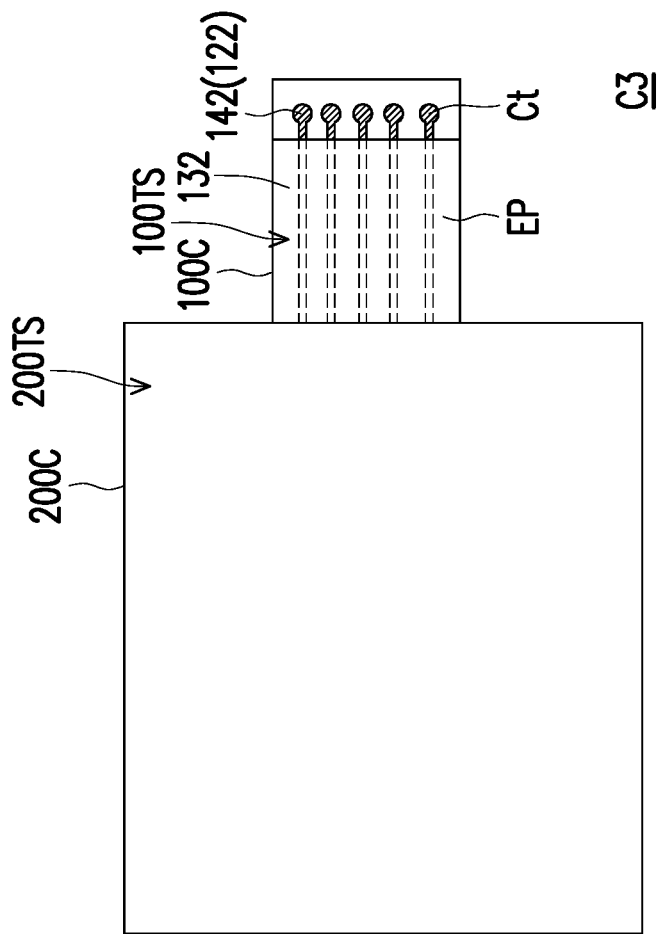
Figure 19:
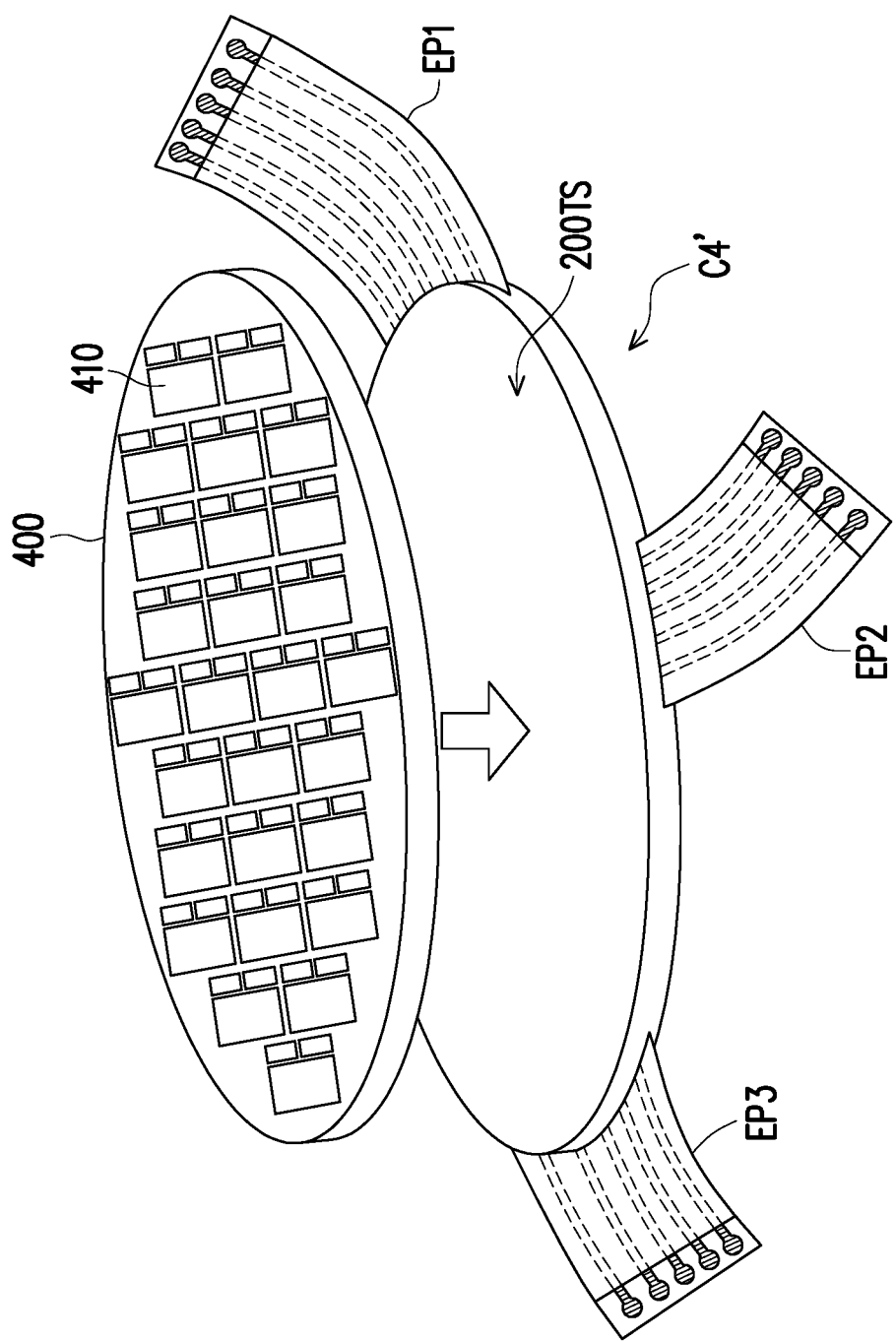
FIG. 19 is a schematic view showing an application of a circuit carrier, in accordance with some embodiments.

FIGS. 17 and 18 are schematic plan views showing different types of circuit carriers in accordance with some embodiments and FIG. 19 is a schematic view showing an application of a circuit carrier in accordance with some embodiments. Referring to FIG. 17 and FIG. 18, a circuit structure 200C of a circuit carrier C3 exhibits a rectangular shape with a top surface 200TS that may be parallel to a top surface 100TS of an extended portion EP of the flexible structure 100C. The flexible structure 100C may be similar to the above-mentioned flexible structure, for example, a portion of the flexible structure 100C is sandwiched within the circuit structure 200C and the other portion (i.e. the extended portion EP) of the flexible structure 100C extend out from the circuit structure 200C. The extended portion EP may at least include the terminal-connecting portion Ct of the conductive pattern (e.g., 122) with the surface finish layer (e.g., 142) formed thereon. Since portions of the conductive pattern (e.g., 122) are covered by the coverlay layer 132, these portions of the conductive pattern (e.g., 122) are illustrated as dashed lines in the drawings. It should be appreciated that the layout of the top surface 200TS of the circuit structure 200C and the top surface 100TS of the flexible structure 100C are omitted from the drawing for ease of description and any circuitry layout may be employed as appropriate for a given application.

In some embodiments, panel-level processing is compatible with the circuit carrier C3. For example, the circuit structure 200C and/or the flexible structure 100C of the circuit carrier C3 may be manufactured in a rectangular or polygonal shape or in accordance with the panel form. In some other embodiments, a large plurality of the circuit carriers C3 are manufactured, which is cut into individual circuit carrier C3 when the manufacturing process is complete or nearly so. The cross-section of the circuit carrier C3 may be similar to that of the circuit carrier C1 (or C2), so the detailed description is omitted for brevity.

As shown in FIG. 18, a circuit structure 200D of a circuit carrier C4 may be formed to match the shape of the to-be-received electronic device, and the circuit structure 200D may be formed in a round or elliptical type (such as a wafer form). In some embodiments, the circuit carrier C4 is compatible with the wafer level processing utilizing the whole wafer or wafer form packages. The flexible structure 100D sandwiched within the circuit carrier C4 includes the extended portion EP, functioning as a flexible connector or to provide a flexible connection. The cross-section of the circuit carrier C4 may be similar to that of the circuit carrier C1 (or C2), so the detailed description is omitted for brevity.

Referring to FIG. 19, the circuit carrier C4' may be similar to the circuit carrier C4 except that the circuit carrier C4' includes more than one extended portions (e.g., portions EP1, EP2, EP3). In some embodiments, those extended portions EP1, EP2, EP3, extended from the edges of the circuit structure, are oriented in the different directions depending on the design requirements. Those extended portions EP1, EP2, EP3 may be configured in the same plane within the circuit structure. In alternative embodiments, those extended portions EP1, EP2, EP3 may be interposed in different stacked layers within the circuit structure. In alternative embodiments, those extended portions may be vertically stacked over one another and may be oriented in the same direction.

The circuit carrier C4' (or any one of the circuit carrier C1 through C4) may be compatible with high-end device applications (e.g., high performance computing application). For example, an electronic device 400 is provided and may be mounted onto the circuit carrier C4' directly or may be mounted through any suitable electrical component (e.g., interposer, package substrate, or the like) so as to form an electronic assembly. For example, the electronic device 400 may be a wafer form device or wafer form package including more than one chips 410 packaged therein. The chips 410 may be arranged in an array in the wafer form package and may respectively be an application-specific integrated circuit (ASIC) chip, an analog chip, a sensor chip, a wireless and radio frequency chip, a voltage regulator chip, a memory chips, or any suitable active or passive devices. The number of the chips 410 may be adjusted according to design of products, which is not limited in the disclosure. In some embodiments, the chips 410 may be packaged using any suitable semiconductor processes for protection.

In some embodiments, a wafer form electronic device 400 may be mounted onto the top surface 200TS of the circuit carrier C4' through, for example, conductive terminals (not shown). The circuit carrier C4' may be sized so as to be compatible with the wafer form electronic device 400. In some embodiments, additional electronic device(s) (not shown) may be connected to the extended portion(s) EP1/EP2/EP3 of the circuit carrier C4' so as to provide electrical communication to (or between) the electronic device(s). Accordingly, it is not necessary to reserve space in the circuit carrier for the placement of connectors to install the electronic device(s) so that the circuit carrier in the disclosure allows the size thereof to be effectively reduced, which in turn enables the installation space of the circuit carrier of the electronic assembly to be desirably reduced so as to meet the demands of profile miniaturization of the electronic assembly.

Figure 20:
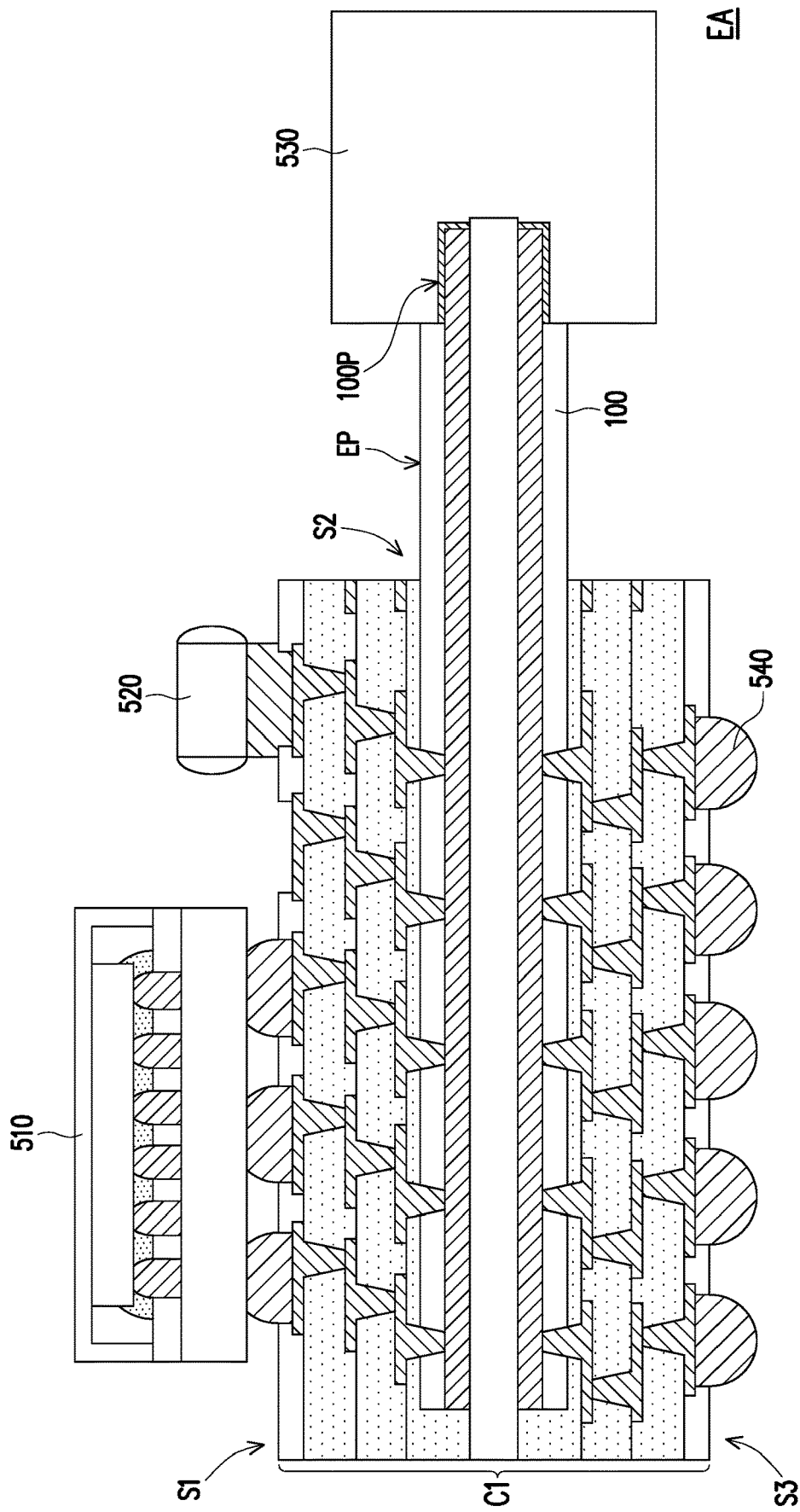
FIG. 20 is a schematic cross-sectional view showing an electronic assembly, in accordance with some embodiments.

FIG. 20 is a schematic cross-sectional view showing an electronic assembly, in accordance with some embodiments. Referring to FIG. 20, an electronic assembly EA includes the circuit carrier C1, first electronic devices 510, 520 disposed on a first side S1 of the circuit carrier C1, a second electronic device 530 disposed on the extended portion EP at a second side S2 of the circuit carrier C1, and a plurality of external terminals 540 disposed on a third side S3 of the circuit carrier C1. The first side S1 and the third side S3 are opposite to each other and the second side S2 is connected to the first side S1 and the third side S3. It should be appreciated that the circuit carrier C2 through C4 or C4' described above may be applied to form the electronic assembly EA, according to some embodiments. The second electronic device 530 is electrically and physically connected to the peripheral region 100P of the flexible structure 100. In some embodiments, the second electronic device 530 may be detachably connected to the flexible structure 100 of the circuit carrier C1. In some embodiments, the extended portion EP of the circuit carrier C1 serving as a plug-in connector is connected to the second electronic device 530 in an electrically conductive manner.

In some embodiments, the first electronic devices 510 and 520 (or the second electronic device 530) may include semiconductor packages, such as System-On-Chip (SoC), Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. The first electronic device(s) 510, 520 and the second electronic device(s) 530 may include a wide variety of devices, such as processors, resistors, capacitors, transistors, diodes, fuse devices, memories, discrete electronic devices, power coupling devices or power systems, thermal dissipation devices, and/or the like. The external terminals 540 may be ball grid array (BGA) connectors, solder balls, metal pillars, and/or the like. In some embodiments, a high distribution density of the external terminals 540 is provided to meet the design requirements. In some embodiments, the external terminals 540 are available to be mounted onto additional electrical component(s) (e.g., circuit carrier(s), system board(s), mother board(s), etc.). Since electronic devices may be directly mounted onto the circuit carrier without using additional connector(s), insertion loss and return loss due to installation may be reduced, thereby improving the electrical performance. Accordingly, good electrical match of the high speed input/output to the electronic device(s) may be achieved, while the mechanical reliability of the structure remains high.

In accordance with some embodiments of the disclosure, an electronic assembly includes a first wafer including a stack of alternating first dielectric layers and first circuit layers; a flexible structure including a second dielectric layer and a second circuit layer covered by the second dielectric layer, the flexible structure further including a first region embedded in the first wafer and a second region connected to the first region and extending out from an edge of the first wafer; and a second wafer stacked upon the first wafer and including chip packages arranged in an array, the chip packages being electrically coupled to the second circuit layer of the flexible structure through the first circuit layers of the first wafer.

In accordance with some embodiments of the disclosure, an electronic assembly includes a first structure including a flexible dielectric layer and a conductive pattern overlying the flexible dielectric layer; a second structure stacked upon the first structure and including a laminated dielectric layer and a circuit layer overlying the laminated dielectric layer, wherein the first structure comprises an extended region extending beyond a periphery of the second structure; a wafer-form device stacked upon the second structure and electrically coupled to the conductive pattern of the first structure through the circuit layer of the second structure, wherein in a vertical projection along a stacking direction of the wafer-form device and the second structure, a periphery of the wafer form device is substantially aligned with the periphery of the second structure.

In accordance with some embodiments of the disclosure, an electronic assembly includes a rigid circuit structure; a flexible circuit structure including an embedded region located in the rigid circuit structure and a first extended region connected to the embedded region and exposed by the rigid circuit structure, wherein a rigidity of the rigid circuit structure is higher than that of the first extended region; and a wafer-form device disposed on the rigid circuit structure and electrically coupled to the flexible circuit structure through the flexible circuit structure, wherein a width of the rigid circuit structure is substantially equal to a width the wafer-form device and less than a width of the flexible circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic assembly, comprising:
a first wafer comprising a stack of alternating first dielectric layers and first circuit layers;
a flexible structure comprising a second dielectric layer and a second circuit layer covered by the second dielectric layer, the flexible structure further comprising a first region embedded in the first wafer and a second region connected to the first region and extending out from an edge of the first wafer; and
a second wafer stacked upon the first wafer and comprising chip packages arranged in an array, the chip packages being electrically coupled to the second circuit layer of the flexible structure through the first circuit layers of the first wafer.

2. The electronic assembly of claim 1, wherein a conductive via of the first circuit layers passes through the second dielectric layer to be in direct contact with the second circuit layer.

3. The electronic assembly of claim 1, wherein the second region of the flexible structure is foldable to be plugged in an electronic device.

4. The electronic assembly of claim 3, wherein the electronic device is detachably engaged with an end portion of the second circuit layer in the second region of the flexible structure, and the electronic device is electrically coupled to the first wafer and the second wafer through the flexible structure.

5. The electronic assembly of claim 1, wherein the first wafer is sized to substantially match a size of the second wafer.

6. The electronic assembly of claim 1, wherein a rigidity of the first dielectric layers is higher than that of the second dielectric layer.

7. The electronic assembly of claim 1, wherein the second circuit layer overlies a surface of the second dielectric layer and one of the first dielectric layers is in direct contact with an outer sidewall of the second circuit layer and the surface of the second dielectric layer.

8. The electronic assembly of claim 1, wherein outer sidewalls of dummy patterns of the first circuit layers are substantially leveled with outer sidewalls of the first dielectric layers at the edge of the first wafer.

9. An electronic assembly, comprising:
a first structure comprising a flexible dielectric layer and a conductive pattern overlying the flexible dielectric layer;
a second structure stacked upon the first structure and comprising a laminated dielectric layer and a circuit layer overlying the laminated dielectric layer, wherein the first structure comprises an extended region extending beyond a periphery of the second structure;
a wafer-form device stacked upon the second structure and electrically coupled to the conductive pattern of the first structure through the circuit layer of the second structure, wherein in a vertical projection along a stacking direction of the wafer-form device and the second structure, a periphery of the wafer form device is substantially aligned with the periphery of the second structure.

10. The electronic assembly of claim 9, wherein a conductive via of the circuit layer passes through the flexible dielectric layer to be in direct contact with the conductive pattern.

11. The electronic assembly of claim 9, wherein the conductive pattern overlies a surface of the flexible dielectric layer and the laminated dielectric layer is in direct contact with an outermost sidewall of the conductive pattern and the surface of the flexible dielectric layer.

12. The electronic assembly of claim 9, wherein an outer sidewall of a dummy pattern of the circuit layer is substantially leveled with an outer sidewall of the laminated dielectric layer.

13. The electronic assembly of claim 9, wherein the wafer-form device comprises chip packages arranged in an array and electrically coupled to the conductive pattern of the first structure through the circuit layer of the second structure.

14. The electronic assembly of claim 9, wherein an end portion of the conductive pattern in the extended region of the first structure is detachably coupled to an electronic device.

15. The electronic assembly of claim 9, wherein the extended region comprises a first segment and a second segment extending toward a direction different from an extending direction of the first segment.

16. An electronic assembly, comprising:
a rigid circuit structure;
a flexible circuit structure comprising an embedded region located in the rigid circuit structure and a first extended region connected to the embedded region and exposed by the rigid circuit structure, wherein a rigidity of the rigid circuit structure is higher than that of the first extended region; and
a wafer-form device disposed on the rigid circuit structure and electrically coupled to the flexible circuit structure through the flexible circuit structure, wherein a width of the rigid circuit structure is substantially equal to a width of the wafer-form device and less than a width of the flexible circuit structure.

17. The electronic assembly of claim 16, wherein the flexible circuit structure further comprises a second extended region spaced apart from the first extended region and extending toward a direction different from an extending direction of the first extended region in a top-down view.

18. The electronic assembly of claim 16, wherein a conductive via of a circuit layer of the rigid circuit structure passes through a flexible dielectric layer of the flexible circuit structure to be in direct contact with a conductive pattern of the flexible circuit structure.

19. The electronic assembly of claim 18, wherein a flexibility of the flexible dielectric layer is higher than that of a laminated dielectric layer of the rigid circuit structure.

20. The electronic assembly of claim 16, wherein the wafer-form device comprises chip packages arranged in an array and electrically coupled to the flexible circuit structure through the rigid circuit structure.

* * * * *